US 7,456,911 B2
Eguchi et al.
Nov. 25, 2008

(54) SEMICONDUCTOR DEVICE

(75) Inventors: Shingo Eguchi, Kanagawa (JP); Rumo Satake, Kanagawa (JP)

(73) Assignee: Semiconductor Energy Laboratory Co., Ltd., Atsugi-Shi, Kanagawa-Ken (JP)

( * ) Notice: Subject to any disclaimer, the term of this patent is extended or adjusted under 35 U.S.C. 154(b) by 0 days.

(21) Appl. No.: 09/925,486

(22) Filed: Aug. 10, 2001

(65) Prior Publication Data

US 2002/0021377 A1 Feb. 21, 2002

(30) Foreign Application Priority Data

Aug. 14, 2000 (JP) ............... 2000-245989

(51) Int. Cl.
*G02F 1/136* (2006.01)
(52) U.S. Cl. .............. 349/43; 349/42; 257/59; 257/72; 257/E29.116; 257/E29.117; 257/E29.275; 257/E29.278; 257/E29.279
(58) Field of Classification Search ............ 349/42–43, 349/44, 139, 141, 110, 155; 257/59, 70–72, 257/350, 98, 627
See application file for complete search history.

(56) References Cited

U.S. PATENT DOCUMENTS

| | | | |
|---|---|---|---|
| 5,182,620 A | | 1/1993 | Shimada et al. |
| 5,521,729 A | * | 5/1996 | Ukai et al. .................... 349/42 |
| 5,644,147 A | * | 7/1997 | Yamazaki et al. ............. 257/66 |
| 5,672,888 A | * | 9/1997 | Nakamura .................... 257/72 |
| 5,734,177 A | * | 3/1998 | Sakamoto .................... 257/49 |
| 5,793,460 A | * | 8/1998 | Yang ......................... 349/148 |
| 5,818,070 A | * | 10/1998 | Yamazaki et al. ............. 257/72 |
| 5,856,689 A | | 1/1999 | Suzawa |
| 5,946,060 A | * | 8/1999 | Nishiki et al. ................. 349/48 |
| 6,023,074 A | | 2/2000 | Zhang |
| 6,088,070 A | * | 7/2000 | Ohtani et al. ................. 349/38 |
| 6,259,117 B1 | | 7/2001 | Takemura et al. |
| 6,275,061 B1 | * | 8/2001 | Tomita ...................... 324/770 |
| 6,278,131 B1 | | 8/2001 | Yamazaki et al. |
| 6,278,503 B1 | * | 8/2001 | Nishikawa et al. ............ 349/39 |
| 6,392,255 B1 | * | 5/2002 | Shibata et al. ................ 257/59 |

(Continued)

FOREIGN PATENT DOCUMENTS

EP 450 941 * 10/1991

(Continued)

OTHER PUBLICATIONS

S. Theiss et al.; International Electron Devices Meeting; San Francisco, CA; Dec. 8-11, pp. 958-959; 1996.

*Primary Examiner*—Ahmed Sefer
(74) *Attorney, Agent, or Firm*—Fish & Richardson P.C.

(57) ABSTRACT

An unstable factor that the orientation of liquid crystal is fixed and left after a drive power source is turned off is reduced, preferable display quality is realized, and long term reliability is improved. After the drive power source is turned off, in order to block an electric field produced by charges left in a first electrode (485), a second electrode 492 is provided to overlap the first electrode. The first electrode is overlapped at 70% or more of its area with the second electrode. In addition, when the first electrode is used as an electrode composing a retaining capacitor 505, the retaining capacitor is overlapped at 90% or more of its area with the second electrode.

22 Claims, 24 Drawing Sheets

U.S. PATENT DOCUMENTS

| | | | | |
|---|---|---|---|---|
| 6,476,898 | B2 * | 11/2002 | Song et al. | 349/139 |
| 6,515,720 | B1 * | 2/2003 | Iizuka et al. | 349/39 |
| 6,531,713 | B1 * | 3/2003 | Yamazaki | 257/59 |
| 6,559,906 | B1 * | 5/2003 | Kawachi et al. | 349/47 |
| 6,566,684 | B1 | 5/2003 | Suzawa | |
| 6,590,229 | B1 | 7/2003 | Yamazaki et al. | |
| 6,646,287 | B1 * | 11/2003 | Ono et al. | 257/66 |
| 6,789,910 | B2 * | 9/2004 | Kimura et al. | 362/31 |
| 7,351,617 | B2 * | 4/2008 | Yamazaki et al. | 438/149 |
| 2001/0038097 | A1 * | 11/2001 | Inoue | 257/57 |
| 2001/0040656 | A1 * | 11/2001 | Na et al. | 349/110 |
| 2002/0028544 | A1 * | 3/2002 | Fujimoto et al. | 438/166 |
| 2002/0044244 | A1 * | 4/2002 | Lee | 349/141 |
| 2004/0150762 | A1 * | 8/2004 | Segawa et al. | 349/43 |

FOREIGN PATENT DOCUMENTS

| | | | |
|---|---|---|---|
| EP | 1037093 | * | 9/2000 |
| JP | 6-148678 | * | 5/1994 |
| JP | 7-28089 | * | 1/1995 |
| JP | 10-10556 | * | 1/1998 |
| JP | 2001-56652 | * | 2/2001 |
| WO | WO 99/28784 | * | 6/1999 |

* cited by examiner

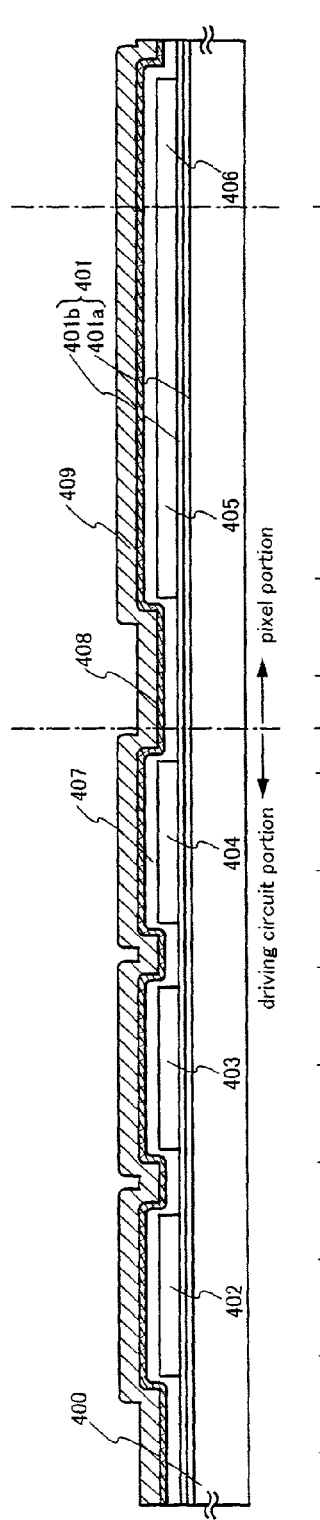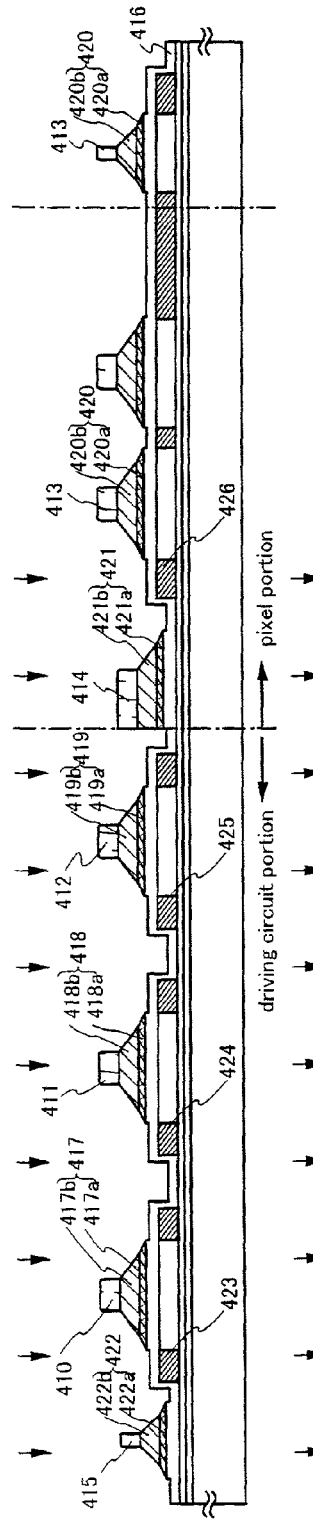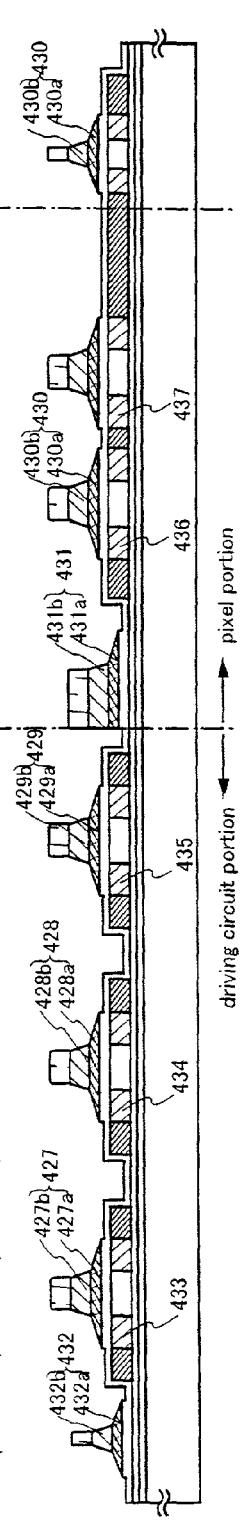

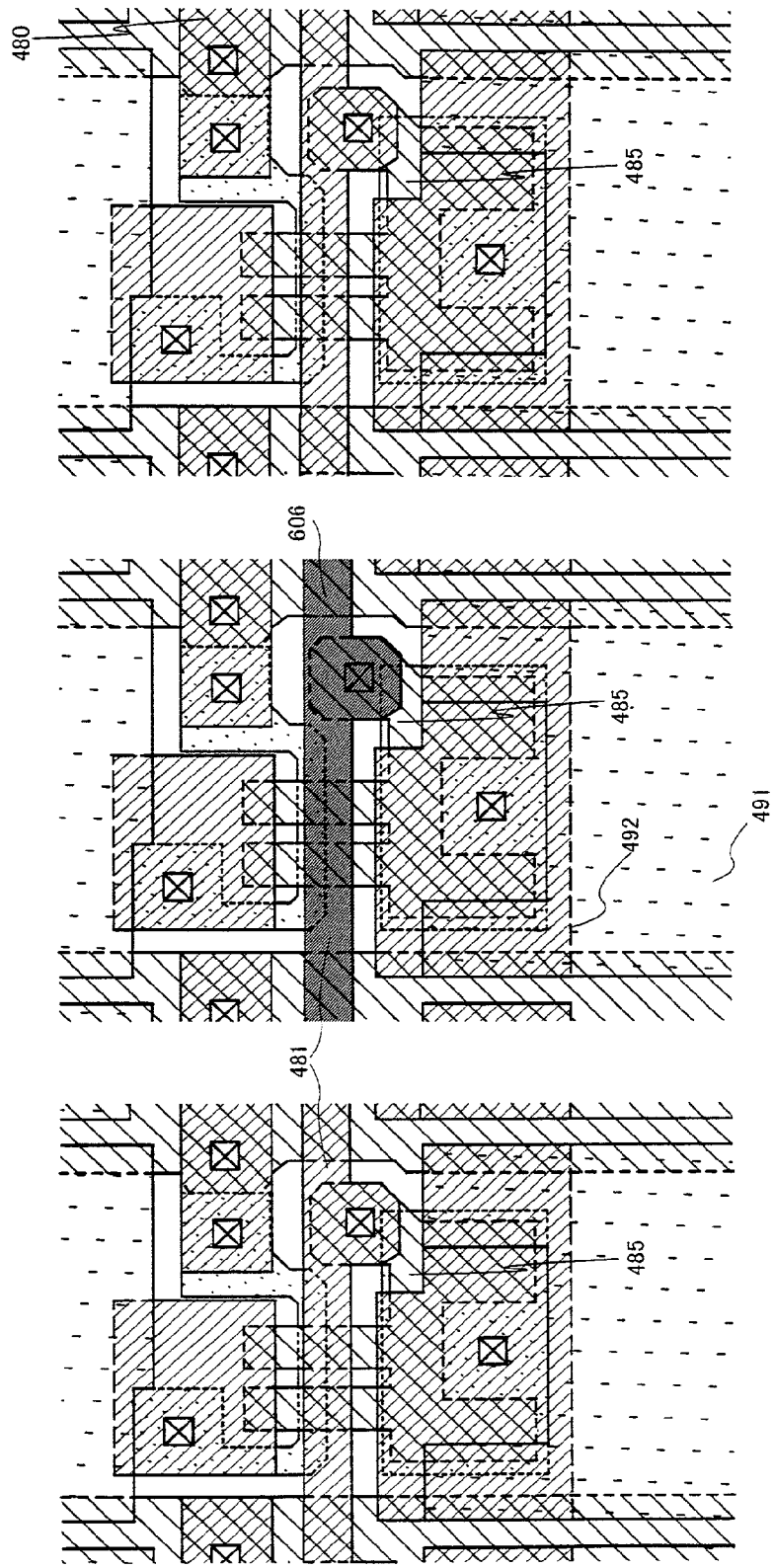

SEMICONDUCTOR DEVICE

BACKGROUND OF THE INVENTION

1. Field of the Invention

The present invention relates to a semiconductor device having a circuit composed of thin film transistors and to a method of manufacturing the same, for example, an electrooptical device which is represented by a liquid crystal display panel and an electronic equipment on which such an electrooptical device is mounted as a part.

Note that the semiconductor device in this specification denotes devices in general, which can function by utilizing a semiconductor characteristic. The electrooptical device, a semiconductor circuit, and the electric equipment are entirely the semiconductor device.

Also, note that an element substrate in this specification denotes a substrate in general, with which an element utilizing a semiconductor characteristic is provided. As the element, there are, for example, a thin film transistor, an MOS transistor, and a diode.

2. Description of the Related Art

Recently, a technique for constructing a thin film transistor (TFT) using a semiconductor thin film (about several to several hundreds of nm in thickness) formed on a substrate having an insulating surface for has been noted. The thin film transistor is widely applied to an electronic device such as an IC or the electrooptical device. In particular, a development of the thin film transistor as a switching element of a liquid crystal display device is hastened.

In the liquid crystal display device, in order to obtain a high quality image, an active matrix liquid crystal display device in which pixel electrodes are arranged in matrix and the thin film transistor is used as a switching element connected with the respective pixel electrodes has the attention.

In addition, in a display performance of the active matrix liquid crystal display device, it is desired that a pixel has a large retaining capacitance and a high aperture ratio. When each pixel has the high aperture ratio, light utilization efficiency is improved and low power consumption and miniaturization of a display device can be achieved.

Recently, as a pixel size is minute, a high resolution image is desired. When the pixel size is minute, formation areas of the TFT and a wiring, which are occupied in one pixel is expanded, and thus the pixel aperture ratio is decreased.

Therefore, in order to obtain the high aperture ratio in the respective pixels within a specified pixel size, it is necessary to make the layout of circuit elements required for a circuit structure of the pixel with high efficiency.

Further, for a low cost, it is desired that a pixel having a high aperture ratio be realized with a small number of masks.

In addition, in reliability of the active matrix liquid crystal display device, even when it is used for a long period, it is desired that constant display be made without changing an orientation of liquid crystal.

Various studies have been made to achieve the above technique. As a result, the liquid crystal display device having the following structure is realized.

First, in order to realize the liquid crystal display device having a high pixel aperture ratio with a small number of masks, a pixel structure shown in top views of FIGS. 16 and 17 is manufactured. FIG. 17 is a partially enlarged view of FIG. 16. A cross section cut along a dashed line A-A' in the top view of FIG. 16 is shown in FIG. 9. Cross sections cut along dashed lines C-C' in the top views of FIGS. 16 and 17 are shown in FIGS. 2A and 2B.

In the structures shown in FIGS. 16 and 17, a first electrode 485 intersects a first semiconductor film 484 through a gate insulating film and has a function as a gate electrode. In addition, the first electrode 485 and a second semiconductor film 493 are used as capacitor electrodes and the gate insulating film is used as dielectric, and thus a retaining capacitor is formed. That is, the first electrode has double functions as the gate electrode and the capacitor electrode. A gate wiring 481 is connected with the first electrode 485 through contact hole.

In addition, a second electrode 492 is connected with the second semiconductor film 493 through a contact hole. The second electrode 492 has a region in which is in contact with a pixel electrode 491. Through the second electrode 492, the second semiconductor film 493 has the same potential as the pixel electrode 491.

Therefore, with respect to the electrodes composing the retaining capacitor, the first electrode connected with the gate wiring through the contact hole has a gate potential and the second semiconductor film connected with the second electrode 492 through the contact hole has the same potential as the pixel electrode 491.

The structures shown in FIGS. 16 and 17 are characterized in that wirings and electrodes in a TFT element, that is, the first electrode (as gate electrode and capacitor electrode) 485, the gate wiring 481, a source wiring 483, and the pixel electrode 491 are formed using three photo masks, and simultaneously the retaining capacitor is also formed using these three photo masks. In addition, since the pixel electrode 491 can be overlapped on the source wiring 483 through an insulating film (not shown), an aperture ratio can be increased. In FIG. 16, with respect to a pixel in a VGA with 43 μm×126 μm, an aperture ratio of 54% is achieved.

However, in the above liquid crystal display device, a phenomenon is observed that the orientation of the liquid crystal located over the first electrode 485 is left after a drive power source is turned off. Thus, there is an anxiety in reliability for a long period. Hereinafter, this phenomenon will be described based on experimental results.

FIGS. 20A to 20C and 21A to 21C show results of orientations in the pixel portion of the liquid crystal display device, which are observed (A) before a drive power source of a transmission liquid crystal display device having the pixel portion shown in FIGS. 16 and 17 is turned on, (B) while a video voltage having ±1 V is applied, and (C) after the drive power source is turned off. FIGS. 20A to 20C show microscope photographs of the liquid crystal orientation (liquid crystal:ZLI4792). FIGS. 21A to 21C show the liquid crystal orientation (liquid crystal:ZLI4792) near the gate wiring 481. The same elements as FIG. 17 are referred to as the same numerals in FIGS. 21A to 21C.

As the liquid crystal in the transmission liquid crystal display device, positive type liquid crystal ZLI4792 produced by Merck Co., Ltd. is used. An orientation film SE7792 produced by Nissan Chemical Industries, Ltd. is used. The orientation of the liquid crystal is a TN mode. When the orientation is observed, the liquid crystal display device is located such that reflection light and transmission light are simultaneously incident into an optical microscope. An optical system of the microscope is adjusted such that a polarization plate is made with crossed Nicols arrangement with respect to both the transmission light and the reflection light. In order to easily observe a change in the orientation of the liquid crystal, a light shielding film is not intendedly provided in a counter substrate.

With a state before the drive power source is turned on (FIGS. 20A and 21A), a specific phenomenon was not observed in the orientation of the liquid crystal over the first electrode 485.

Next, the orientation of the liquid crystal is examined with a state that the video voltage is applied from the source wiring to the pixel electrode through a pixel TFT.

The orientation in the case where the video voltage having ±1 V is applied by a gate inverse drive is shown in FIGS. 20B and 21B. Since a value of the video voltage is equal to or smaller than a threshold value of the liquid crystal, the liquid crystal over the pixel electrode 491 is not switched. Since a gate voltage having ±8 V or −8 V is applied to the liquid crystals over the gate wiring 481 and the first electrode 485, the liquid crystal responds to an electric field and thus oriented such that a major axis of the liquid crystal is in a direction perpendicular to the surface of the substrate. Since the liquid crystal responds to the electric field and perpendicularly oriented, there is a darkly visible region 601 under the polarization plate with the crossed Nicols. The orientation of the liquid crystal responds to the potentials of the pixel electrode, the gate wiring, the first electrode, and the counter electrode. Thus, any specific orientation is not shown.

However, after the drive power source is turned off, the specific phenomenon was observed in the orientation of the liquid crystal.

The orientation of the liquid crystal after the drive power source is turned off is shown in FIGS. 20C and 21C. The orientation of the liquid crystal over the first electrode 485 was fixed and left. In particular, in several tests, even when the drive power source is turned off, there was a tendency that the orientation of the liquid crystal over the retaining capacitor is fixed and left. This region is indicated by reference numeral 602. After the drive power source is turned off, a time until the liquid crystal orientation region 602 is relaxed with the same state as the liquid crystal orientation over the pixel electrode 491 is 10 minutes to 15 minuets.

Next, the reliability of the liquid crystal is tested at a high temperature of 85° C. After a predetermined image is displayed for a long time, the drive power source is turned off and the orientation of the liquid crystal is examined.

Here, results by the reliability test of the liquid crystal are shown. Photographs with respect to the orientation (liquid crystal:ZLI4792) at a room temperature after a lapse of 100 hours in the reliability test are shown in FIGS. 18A to 18C and 19A to 19C. FIGS. 18A to 18c show orientation photographs. FIGS. 19A to 19C show the orientations of the liquid crystal in the pixel portion. The same elements as FIG. 17 are referred to as the same numerals in FIGS. 19A to 19C. The observation is performed at a room temperature.

Even when the drive power source is tuned off after a lapse of 100 hours in the reliability test, the orientation of the liquid crystal over the first electrode 485 was fixed (FIGS. 18A and 19A). A region in that the orientation of the liquid crystal is fixed is indicated by reference numeral 603.

Also, the orientation in the case where the video voltage having ±1 V is applied by a gate inverse drive is shown in FIGS. 18B and 19B. Since a gate voltage having −8 V is applied to the gate wiring 481 and the first electrode 485, the liquid crystals over these respond to an electric field and thus oriented such that a major axis of the liquid crystal is in a direction perpendicular to the surface of the substrate. Since the liquid crystal responds to the electric field and perpendicularly oriented, there is a darkly visible region 604 under the polarization plate with the crossed Nicols.

Next, the orientation of the liquid crystal after the drive power source is turned off is shown in FIGS. 18C and 19C. While the video voltage having ±1 V is applied, a portion of the orientation of the liquid crystal, which is produced over the first electrode 485 is fixed. A region in that the orientation of the liquid crystal is left after the drive power source is turned off is indicated by reference numeral 605.

Thus, even when the drive power source is turned off after the reliability test is performed at high temperature, the orientation of the liquid crystal over the first electrode, that is, over the retaining capacitor is fixed and left.

After the drive power source is turned off, a time until the orientation of the liquid crystal over the first electrode 485 is relaxed with its original state became longer with the progression of the reliability test. After the reliability rest for 1000 hours, a time until the liquid crystal over the entire display screen is uniformly oriented is longer than 1 hour. Even when 1000 hours elapses in the reliability test, an occurrence position of the region in that the orientation of the liquid crystal is fixed is not changed and thus was over the first electrode.

Thus, in the reliability test at a high temperature, there was a tendency that a relaxation time of the liquid crystal after the drive power source is turned off becomes longer. If there is such a result, in particular, in the transmission liquid crystal display device, there is a fear that an orientation relaxation time of the liquid crystal after the drive power source is turned off becomes longer.

It is necessary to remove as an unstable factor a phenomenon that a specific orientation is left after the drive power source is turned off. This is because, if there is such an unstable factor, it is difficult to obtain the long term reliability of the liquid crystal display device.

For commercialization, it is required that such an unstable orientation is covered by providing a light shielding film in a counter substrate. However, when the light shielding film is provided in the counter substrate, an alignment between the counter substrate and an element substrate is shifted to decrease the aperture ratio, and thus there is a possibility that a display quality is deteriorated.

In addition, with respect to a reflection liquid crystal display device, display is performed using external light, and even if the power source of the liquid crystal display device is turned off, display light is incident into eyes. Thus, if it will be a long time before the orientation of the liquid crystal is relaxed, the variations of light and shade by the relaxation process of the liquid crystal are naturally recognized by user's eyes. In many reflection liquid crystal display devices, a light shielding film is not provided in the counter substrate to increase its intensity. Therefore, the relaxation process of the orientation after the drive power source is turned off is easily recognized relatively to the transmission liquid crystal display device.

SUMMARY OF THE INVENTION

Thus, an object of the present invention is to provide a liquid crystal display device in which an unstable factor that the orientation of the liquid crystal is fixed and left after the drive power source is turned off is removed, the display quality is improved, and the long term reliability is obtained.

Methods for solving the above problems inherent in the conventional technique will be described below in details.

First, the inventors of the present invention considered about a reason for that the orientations of the liquid crystals over the first electrode and the retaining capacitor formed using the first electrode as one electrode are left after the drive power source is turned off. This reason was considered as follows. That is, even if the drive power source is turned off, charges are left in the first electrode and thus the liquid crystal is oriented along an electric field that is produced by the charges left in the first electrode.

A reason for that the charges are left in the first electrode was considered as follows. That is, since the first electrode and the gate wiring 481 are connected with each other through the contact hole, a contact resistance is high and charges in the first electrode are hard to discharge from a structural factor.

According to the present invention, after the drive power source is turned off, the electric field that is produced by the charges left in the first electrode is blocked by the second electrode. Thus, the phenomenon is reduced that the orientation of the liquid crystal is changed by the electric field that is produced by the charges left in the first electrode and then fixed and left.

According to the present invention, an element structure is devised such that the orientation of the liquid crystal is not fixed and left after the drive power source is turned off. Top views of a pixel portion of the present invention are shown in FIGS. 4 and 5. Cross sectional views showing a characteristic of the present invention in the pixel portion are shown in FIGS. 1A and 1B. The same elements as FIGS. 16 and 17 are referred to as the same numerals in FIGS. 1A and 1B, 4, and 5. FIGS. 1A and 1B show cross-sections cut along the dashed lines B-B' in the top views of FIGS. 4 and 5.

The present invention is characterized in that the second electrode 492 is overlapped over the first electrode 485 as shown in FIG. 4. Thus, it was found that the orientation of the liquid crystal, which is fixed and left after the drive power source is turned off decreased to a range that there is practically no problem. At this time, the first electrode 485 is overlapped at 70% of its area with the second electrode 492.

In addition, the retaining capacitor is overlapped at 90% of its area with the second electrode 492.

FIG. 3 shows a region that becomes a retaining capacitor 505. The retaining capacitor is constructed by the first electrode 485 that is in contact with the gate wiring 481 through a contact hole 805, the second semiconductor film 493 that is in contact with the second electrode 492 through a contact hole 804, as electrodes, and a gate insulating film as a dielectric film.

First, the orientation of the liquid crystal after the drive power source is turned off in the case where the present invention is applied will be described.

The orientation of the liquid crystal (liquid crystal: ZLI4792) in the pixel portion before the transmission liquid crystal display device of the present invention is driven, the orientation of the liquid crystal while the video voltage having ±1 V is applied, and the orientation of the liquid crystal after the drive power source is turned off are shown in FIGS. 12A to 12C and 13A to 13C.

FIGS. 12A to 12C are photographs by the microscope and FIGS. 13A to 13C are top views explaining the photographs by the microscope.

FIGS. 12A and 13A show the orientation of the liquid crystal, which is viewed through the microscope, before the drive power source is turned on. The liquid crystal is made with uniform twisted orientation over the entire pixel portion.

FIGS. 12B and 13B show the orientation of the liquid crystal, which is viewed through the microscope, while the video voltage having ±1 V is applied to the transmission liquid crystal display device. The second electrode 492 is overlapped over the first electrode 485. Thus, the electric filed that is produced by the first electrode 485 is blocked by the second electrode.

The second electrode 492 has the same potential as the pixel electrode 491 and a voltage equal to or lower than the threshold value of the liquid crystal is applied to the second electrode 492. Thus, the liquid crystal over the second electrode is not switched.

Since the voltage having −8 V or +8 V is applied over the gate wiring 481, the liquid crystal corresponds to the electric field. This region is indicated by reference numeral 606.

Then, the driver power source is turned off. FIGS. 12C and 13C show the orientation of the liquid crystal after the drive power source is turned off. The orientation of the liquid crystal over the first electrode 485 was returned to normal orientation.

A darkly visible portion over a connection electrode 480 in the pixel located in the left side of the photograph of FIG. 12C is a column spacer formed patterning a photosensitive material. Thus, this is not shown that the orientation of the liquid crystal is disturbed.

Next, although not shown, the video voltage having an amplitude of ±5 V is applied and then the drive power source is turned off. Even in this case, the liquid crystal over the first electrode is returned to the normal orientation and thus a specific orientation was not made.

In addition, the orientations of the liquid crystal (liquid crystal:ZLI4792) after the reliability test of the liquid crystal display device is performed for 100 hours at a high temperature of 85° C. are shown in FIGS. 10A to 10C and 11A to 11C. In a state immediately after it is driven for 100 hours and then the drive power source is turned off (FIGS. 10A and 11A) and a state immediately after it is driven with the set video voltage having ±1 V for several minutes (FIGS. 10B and 11B) and then the drive power source is turned off (FIGS. 10C and 11C), a region in which the orientation of the liquid crystal is fixed was not observed. In other words, as shown in FIGS. 11A and 11C, there is particularly no irregularity in the orientation of the liquid crystal over the first electrode 485. In FIG. 11B, a region in which the liquid crystal is switched by a voltage on the gate wiring at driving is indicated by reference numeral 606.

Although not shown, even when the drive power source is turned off after the video voltage having amplitude of ±5 V is applied, the orientation of the liquid crystal was quickly returned to a normal state.

When the orientation of the liquid crystal over the first electrode 485 after the drive power source is turned off in FIG. 10C is compared with that in FIG. 18C, the utility of the present invention can be easily understood. In other words, according to the present invention, the region in which the orientation of the liquid crystal over the first electrode 485 is fixed, as viewed in FIG. 18C, is not almost observed. Thus, the orientation of the liquid crystal was quickly returned to a normal state even when the drive power source is turned off.

In FIGS. 18C and 19C, the region in that the orientation of the liquid crystal is fixed and left after the drive power source is turned off was decreased to a range that there is practically no problem. In the present invention, the first electrode 485 is overlapped at 70% of its area with the second electrode 492. Of course, as the area of the second electrode 492 that overlaps the first electrode 485 is expanded, the region in that the orientation of the liquid crystal is fixed and left becomes narrower.

Simultaneously, the retaining capacitor is overlapped at 90% of its area with the second electrode 492. Of course, as the area of the second electrode 492 that overlaps the retaining capacitor is expanded, the region in that the orientation of the liquid crystal is fixed and left becomes narrower.

A principle of the above phenomenon will be described using FIGS. 1A and 1B and 2A and 2B.

FIGS. 2A and 2B are views for comparison to the present invention. Cross sectional views of the element structures are obtained by cutting the top views of FIGS. 16 and 17 along the dashed lines C-C'.

In FIGS. 2A and 2B, a counter substrate of the liquid crystal display device is composed of a substrate 701 and a counter electrode 702 which can be formed by patterning a transparent electrode formed on the substrate 701. Orientation films 703 are formed in the counter substrate and the active matrix substrate. Rubbing directions 705 and 706 of the orientation films are orthogonal to each other. The liquid crystal is made with twisted orientation at a twisted angle of 90°.

The orientation of the liquid crystal while the liquid crystal display device is driven with the set video voltage having ±5 V by gate line inversion is shown in FIG. 2A. A voltage difference between a drain electrode 482 and the pixel electrode 491 and the counter electrode 702 is −5 V. A voltage of −8 V is applied to the gate wiring 481. The liquid crystal molecule over the gate wiring 481 is oriented in a direction perpendicular to the surface of the substrate. Although a voltage loss is slightly caused by a first interlayer insulating film 472 and a second interlayer insulating film 473, a voltage equal to or larger than the threshold voltage of the liquid crystal is applied to the liquid crystal over the first electrode 485. Thus, the liquid crystal responds to the electric field. A voltage of ±5 V as the potential of the pixel electrode that is in contact with the second electrode 492 is applied to the liquid crystal over the second electrode 492.

The orientation of the liquid crystal after the drive power source is turned off is shown in FIG. 2B. Charges are left in the first electrode 485 and thus liquid crystal molecule 707 is oriented by the electric field that is produced between a plurality of electrodes and the first electrode 485. In other words, the orientation of the liquid crystal molecule 707 over the first electrode 485 is fixed and then left.

Since the retaining capacitor 505 is constructed using the first electrode, in other words, the orientation of the liquid crystal molecule 707 over the retaining capacitor is fixed and then left.

The liquid crystal molecule 707 over the pixel electrode 491, the drain electrode, and the gate wiring 481 is returned to the normal orientation.

A reason for that the orientation of the liquid crystal is fixed and left as shown in FIG. 2B after the drive power source is turned off was considered as follows. That is, since the first electrode 485 and the gate wiring 481 are connected with each other through the contact hole, a contact resistance is high and charges in the first electrode are hard to discharge from a structural factor.

The cross sections showing a characteristic of the present invention in the pixel portion are shown in FIGS. 1A and 1B. The cross sectional views of FIGS. 1A and 1B are obtained by manufacturing the transmission liquid crystal display device using the active matrix substrate having the pixel portion of FIGS. 4 and 5. FIGS. 1A and 1B show the cross sections obtained by cutting the active matrix substrate of FIGS. 4 and 5 along the dashed lines B-B'.

In FIGS. 1A and 1B, a counter substrate of the liquid crystal display device is composed of a substrate 701 and a counter electrode 702 which can be formed by patterning a transparent electrode formed on the substrate 701. Orientation films 703 are formed in the counter substrate and the active matrix substrate. Rubbing directions 705 and 706 of the orientation films are orthogonal to each other. The liquid crystal is injected between the substrates.

The orientation of the liquid crystal while the liquid crystal display device is driven with the set video voltage having ±5 V by gate line inversion is shown in FIG. 1A. The drain electrode 482 and the pixel electrode 491 have a potential of −5 V. The second electrode 492 that is in contact with the pixel electrode of an adjacent pixel has a potential of +5 V. The gate wiring 481 has a potential of −8 V. A voltage sufficient to orient liquid crystal molecule 707 in a direction perpendicular to the surface of the substrate is applied.

The orientation of the liquid crystal after the drive power source is turned off is shown in FIG. 1B. Even if charges are left in the first electrode 485, an electric field by the charges is blocked by the second electrode 492. Thus, the orientation of the liquid crystal over the first electrode 485 becomes twisted orientation indicated in the case of a voltage of 0 V.

When the comparison with respect to the orientation of the liquid crystal molecule is made in FIGS. 1B and 2B, an effect of the present invention is easily understood. According to the structure of FIG. 1B, to which the present invention is applied, there is the following effect. That is, the electric filed that is produced by the charges left in the first electrode 485 after the drive power source is turned off is blocked by the second electrode 492, and thus the leakage of the electric field into a liquid crystal layer is prevented. Therefore, after the drive power source is turned off, the orientation of the liquid crystal is not fixed and left, and thus returned to the normal orientation.

According to the present invention, such an unstable factor that the orientation is fixed to be left can be decreased.

The present invention can be applied to an electrooptical device that is represented by a liquid crystal display device. In addition, the present invention can be widely applied to a semiconductor device for performing display by applying the electric field.

BRIEF DESCRIPTION OF THE DRAWINGS

In the accompanying drawings:
FIGS. 7A to 7C are cross sectional views showing a process for manufacturing a thin film transistor.

FIGS. 13A to 13C are top views showing the orientation of the liquid crystal in the liquid crystal display device of the present invention;

FIGS. 23A to 22D show examples of the electronic equipment; and

DETAILED DESCRIPTION OF THE PREFERRED EMBODIMENTS

Figure 1A:
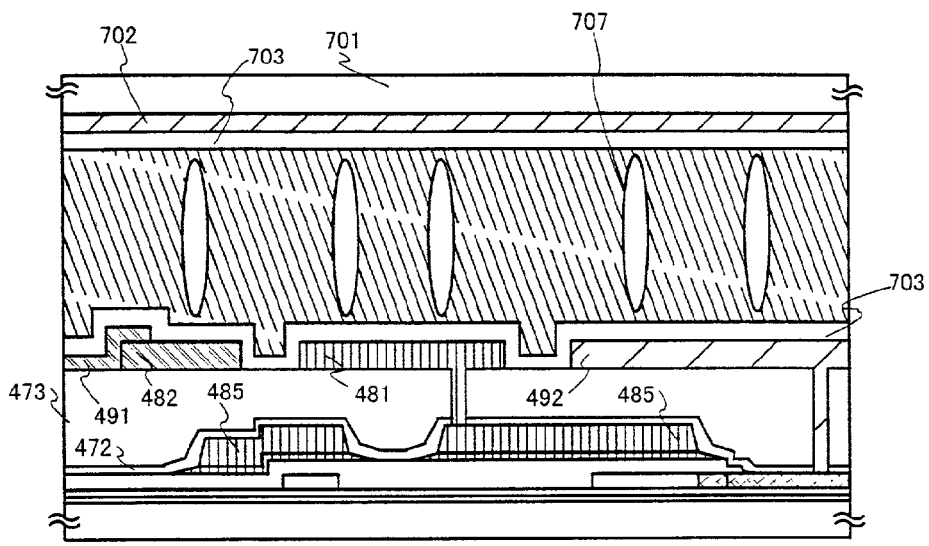
FIGS. 1A and 1B are views explaining a principle of the present invention.
Figure 1B:
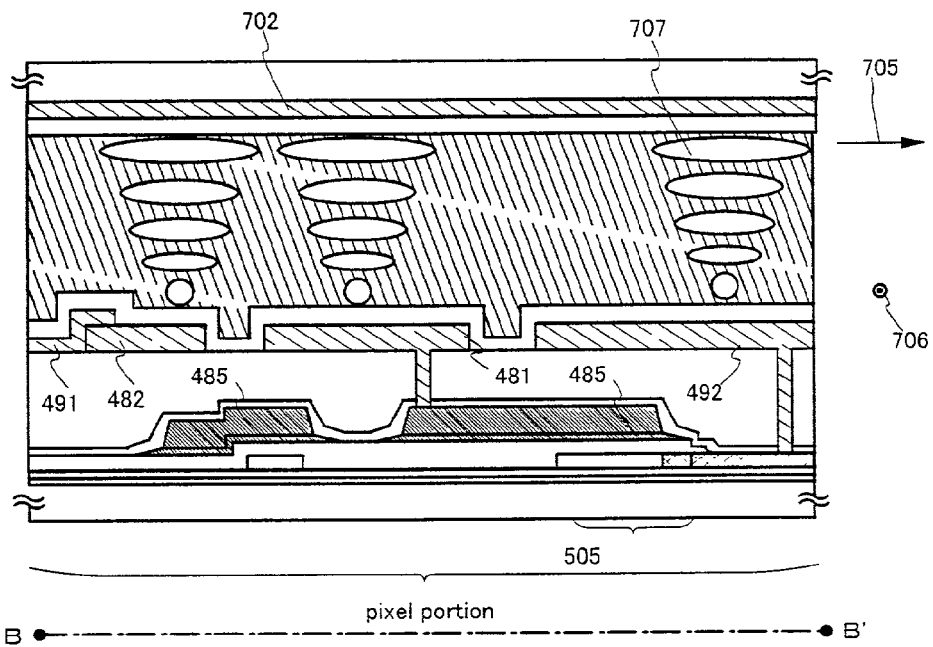
Figure 2A:
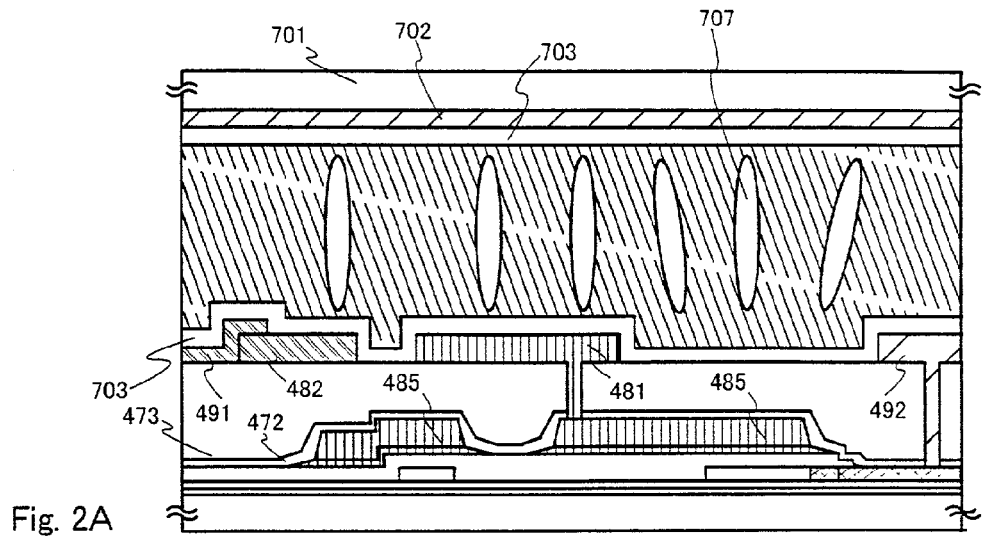
FIGS. 2A and 2B are comparison views explaining a principle of the present invention.
Figure 2B:
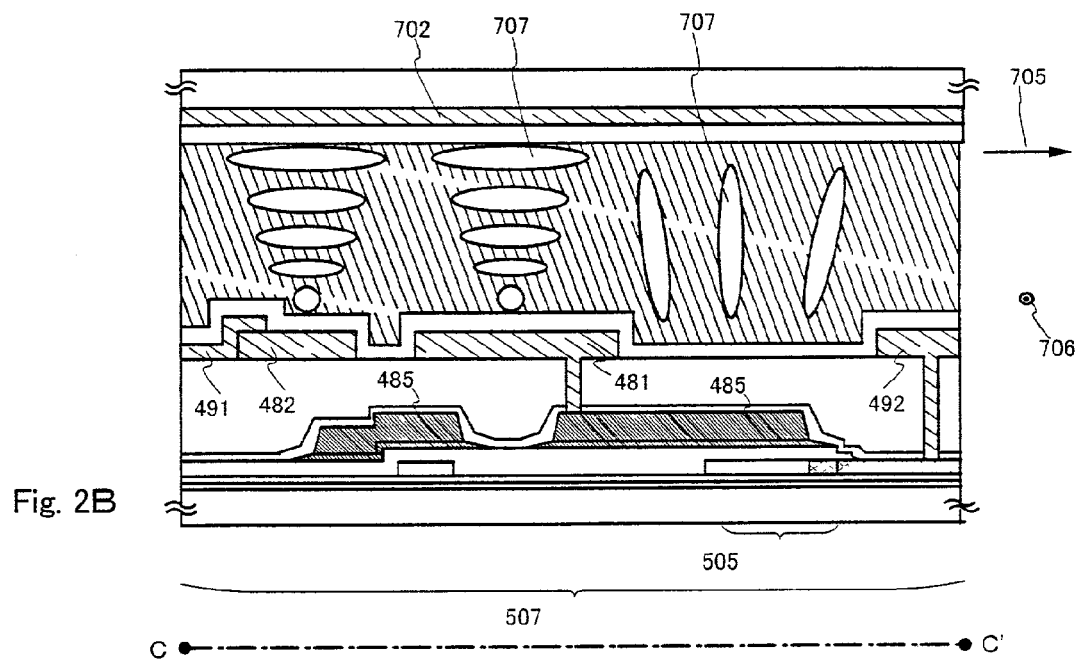
Figure 3:
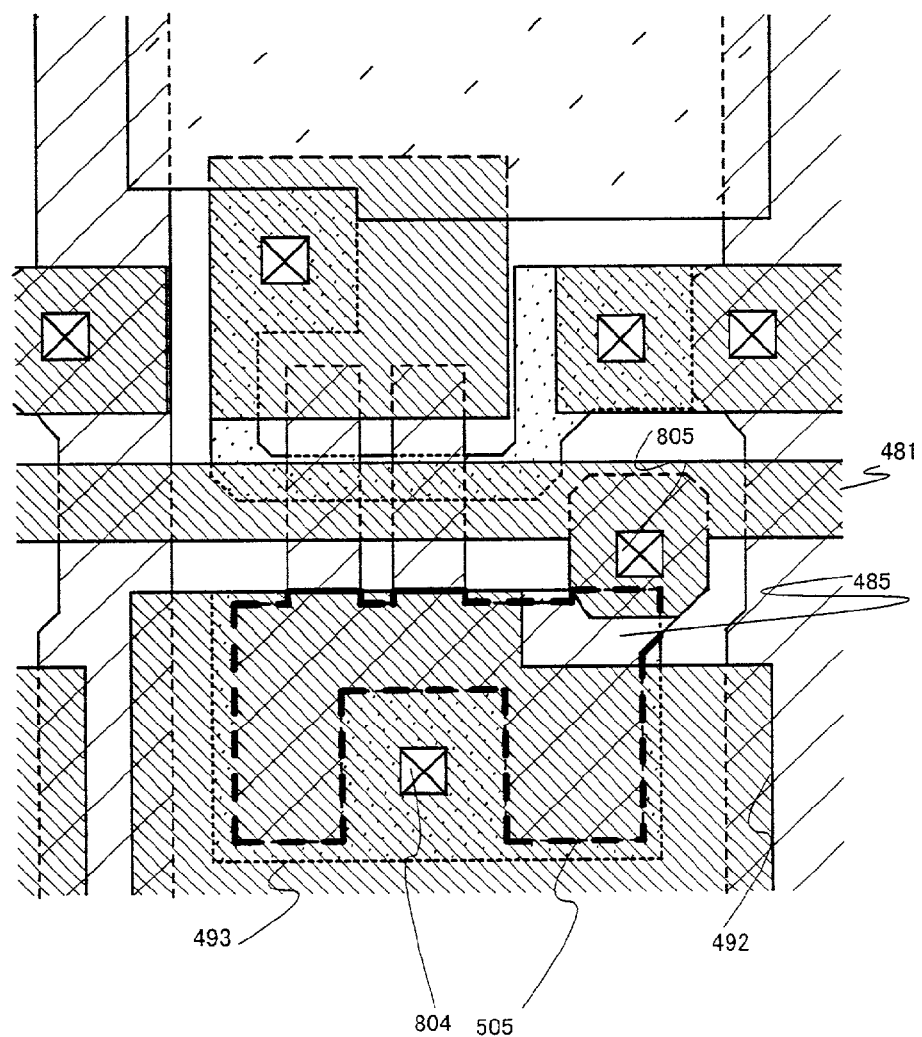
FIG. 3 is a top view of a pixel portion of the present invention.
Figure 4:
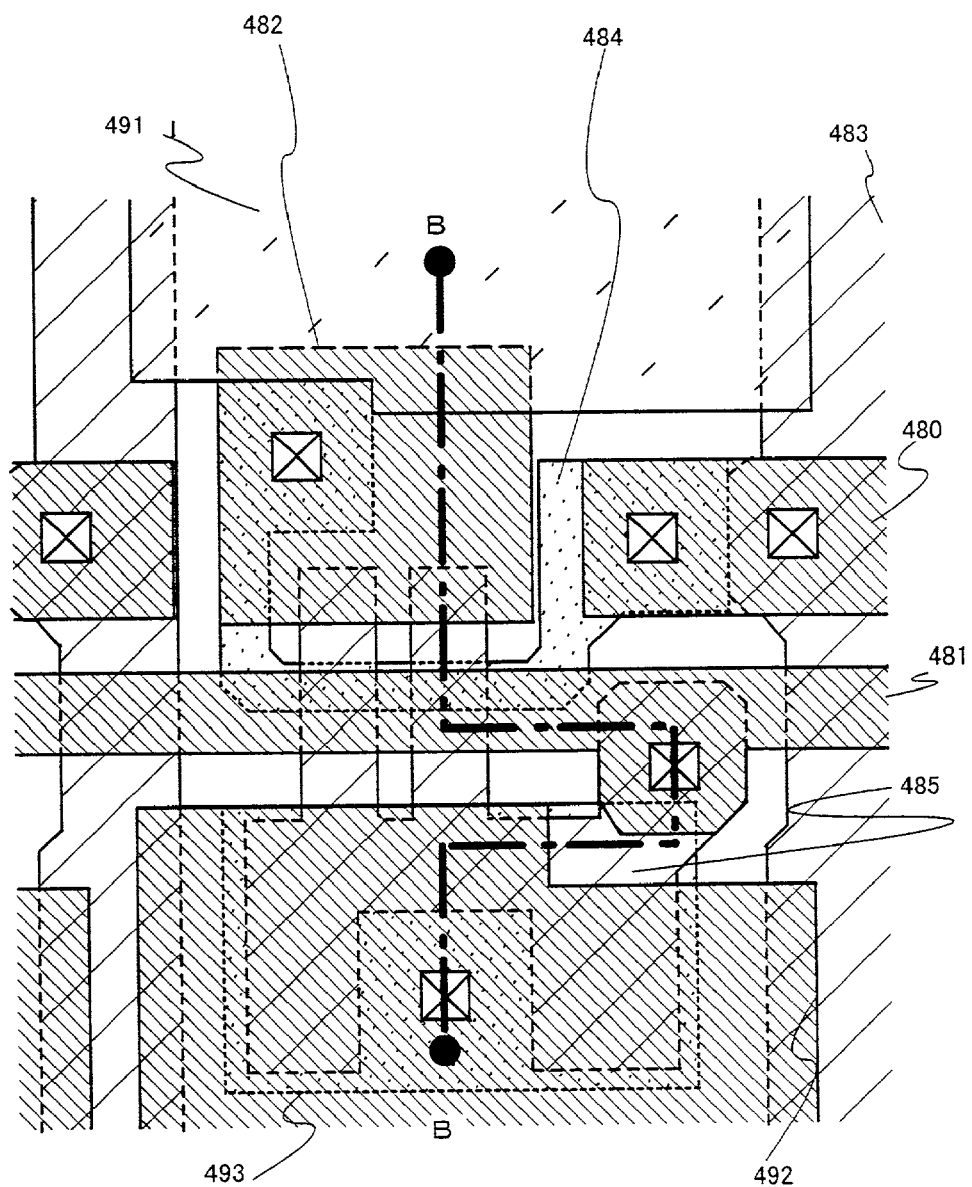
FIG. 4 is a top view of the pixel portion of the present invention.
Figure 5:
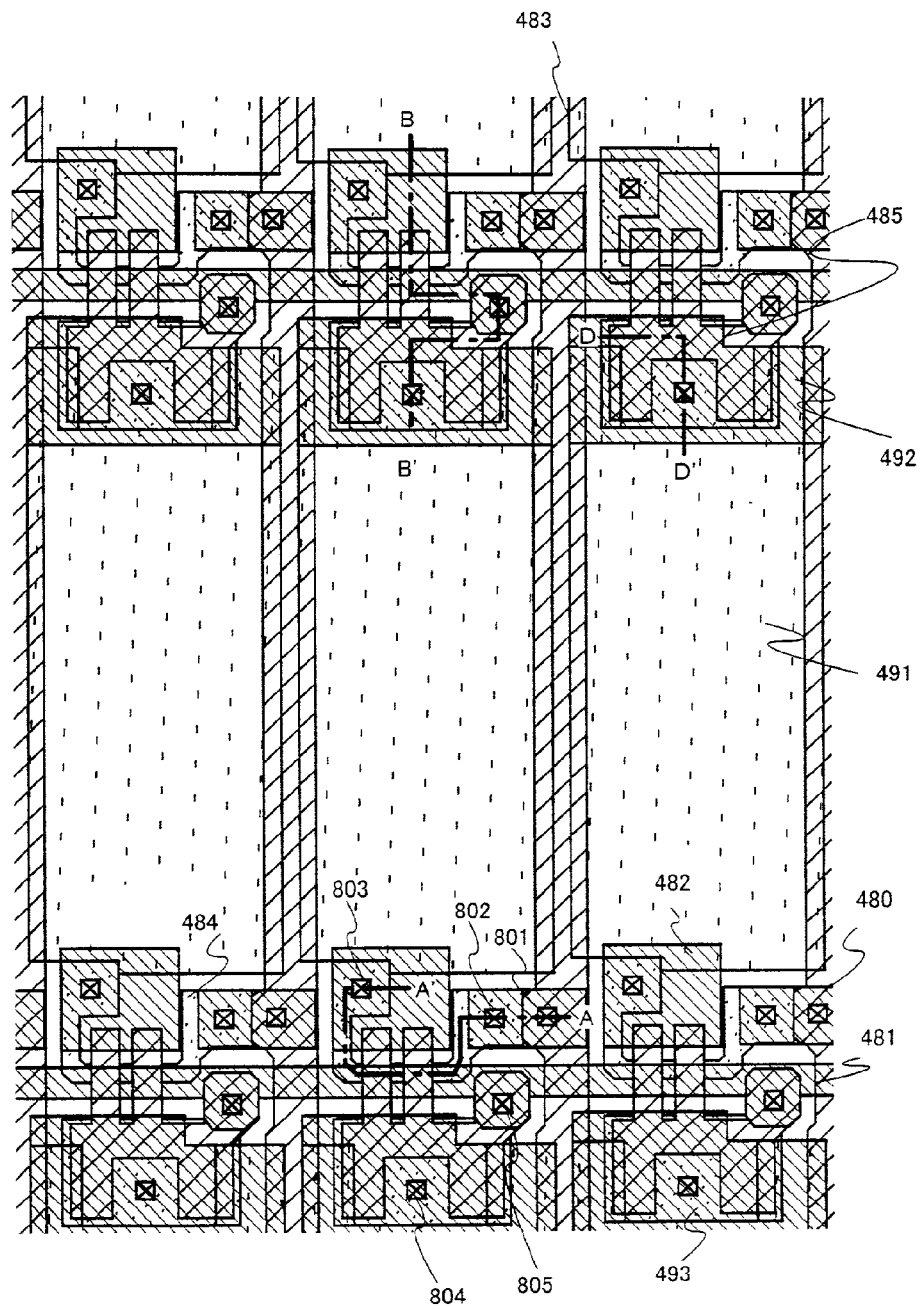
FIG. 5 is a top view of the pixel portion of the present invention.

An embodiment mode of the present invention will be described below using FIGS. 1A and 1B and 5. FIG. 5 shows a top view of a pixel portion of an active matrix substrate. FIGS. 1A and 1B show cross sections obtained by cutting the top view of the pixel portion of FIG. 5 along a dashed line B-B'.

The active matrix substrate includes a gate wiring 481 arranged in a row direction, a source wiring 483 arranged in a column direction, a pixel portion having a pixel TFT near the intersection of the gate wiring and the source wiring, and a driver circuit having an n-channel TFT and a p-channel TFT. Note that the gate wiring indicates a gate wiring 481 electrically connected with the gate electrode 485.

As shown in FIG. 5, in the pixel portion, a first semiconductor film 484 and a second semiconductor film 493 are formed. The first semiconductor film 484 functions as the active layer of a TFT element in practice. The second semiconductor film 493 functions as a capacitor electrode of a retaining capacitor 505 as described later.

After a gate insulating film (not shown) is formed, a first electrode 485 and the source wiring 483 are formed so as to be in contact with the gate insulating film.

As the insulating film, a first interlayer insulating film and a second interlayer insulating film (both not shown) are formed. As the first interlayer insulating film, an inorganic film such as silicon oxide or silicon oxynitride is used. A film thickness of the first interlayer insulating film is set to be 10 nm to 400 nm. As the second interlayer insulating film, an organic resin film such as an acrylic resin film, a polyimide resin film, or a benzocyclobutene (BCB) film is used. A film thickness of the second interlayer insulating film is set to be 0.8 µm to 1.6 µm. A total film thickness of the first interlayer insulating film and the second interlayer insulating film is equal to or thinner than 2.0 µm. Relative dielectric constants of the first interlayer insulating film and the second interlayer insulating film are 3.0 to 4.0.

Next, the first interlayer insulating film and the second interlayer insulating film are patterned to form contact holes 801 to 805.

Next, after a conductor film is formed, the gate wiring 481, a connection electrode 480, the second electrode 492, and the drain electrode 482 are formed by patterning.

By the contact holes 801 and 802, the first semiconductor film 484 and the source wiring 483 are electrically connected with each other through the connection electrode 480.

By the contact hole 803, the first semiconductor film 484 and the drain wiring 482 are electrically connected with each other.

By the contact hole 804, the second semiconductor film 493 and the second electrode 492 are electrically connected with each other.

By the contact hole 805, the first electrode 485 and the gate wiring 481 are electrically connected with each other.

Next, a transparent electrode is patterned and thus a pixel electrode 491 is formed to overlap the drain electrode 482 and the second electrode 492.

With respect to the retaining capacitor, the second semiconductor film 493 and the first electrode 485, which are provided in each pixel are used as electrodes. The gate insulating film (not shown) functions as a dielectric film of the retaining capacitor. The second semiconductor film 493 has the same potential as the pixel electrode 491. The first electrode 485 has the same potential as the gate wiring.

Here, the first electrode 485 is overlapped at 70% or more of its area with the second electrode 492. Alternatively, instead of the second electrode, the first electrode 485 may be overlapped at 70% or more of its area with the pixel electrode 491 or the pixel electrode and the second electrode. In other wards, the first electrode 485 is overlapped at 70% or more of its area with a semiconductor film having conductivity.

In addition, on an insulating film that the first interlayer insulating film and the second interlayer insulating film are laminated, the retaining capacitor may be overlapped at 90% or more of its area with the second electrode 492.

In this embodiment, the transmission liquid crystal display device is shown. However, when the drain electrode is formed using aluminum, silver, or the like, which has a high reflectance and thus has a function as the pixel electrode, a reflection liquid crystal display device can be manufactured.

As in this embodiment, when a film thickness of the insulating film as a laminate layer of the first interlayer insulating film and the second interlayer insulating film is equal to or thinner than 2.0 µm, the electric field that is produced by the left charges is separately applied to the liquid crystal. Thus, even after the driver power source is turned off, the orientation of the liquid crystal is easy to fix and leave.

However, according to this embodiment, after the driver power source is turned off, the orientations of the liquid crystals over the first electrode and the retaining capacitor formed using the first electrode are quickly returned to the normal state.

This is because the electric field produced by the charges left in the electrode after the driver power source is turned off is blocked by the conductor film (the second electrode) and thus the leakage of the electric field into the liquid crystal layer can be prevented.

In the present invention made with the above structure, the following embodiment will be described in details.

Embodiment 1

Figure 8A:
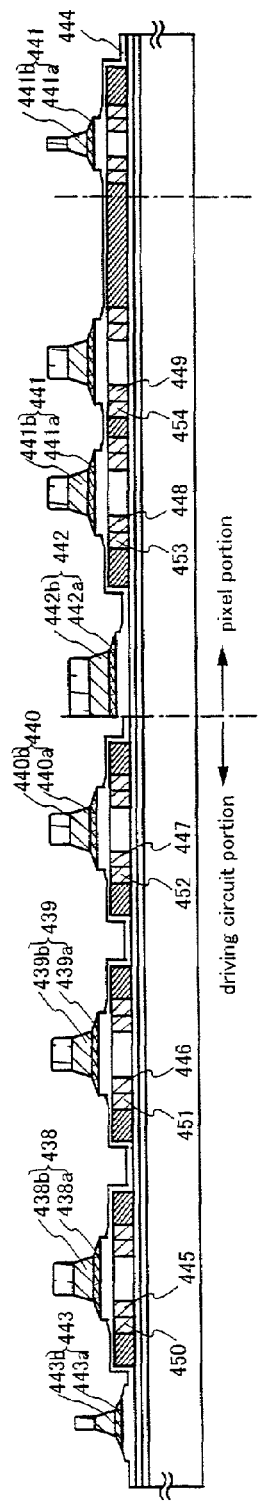
FIGS. 8A to 8C are cross sectional views showing a process for manufacturing the thin film transistor.
Figure 8B:
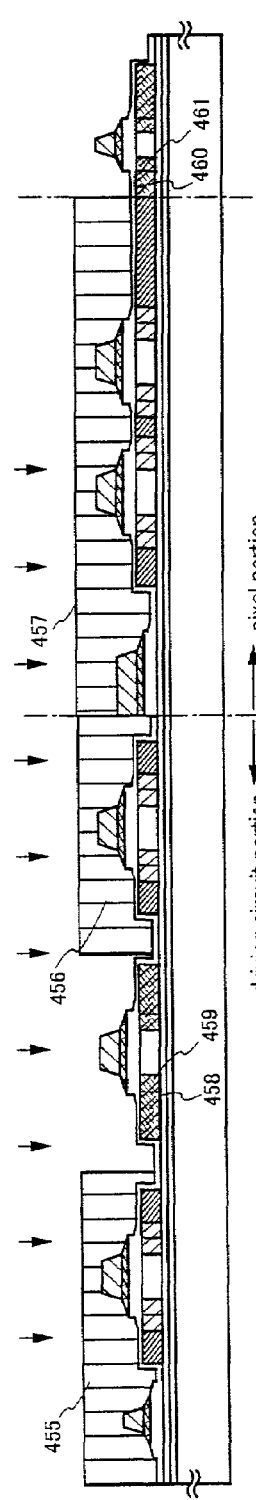
Figure 8C:
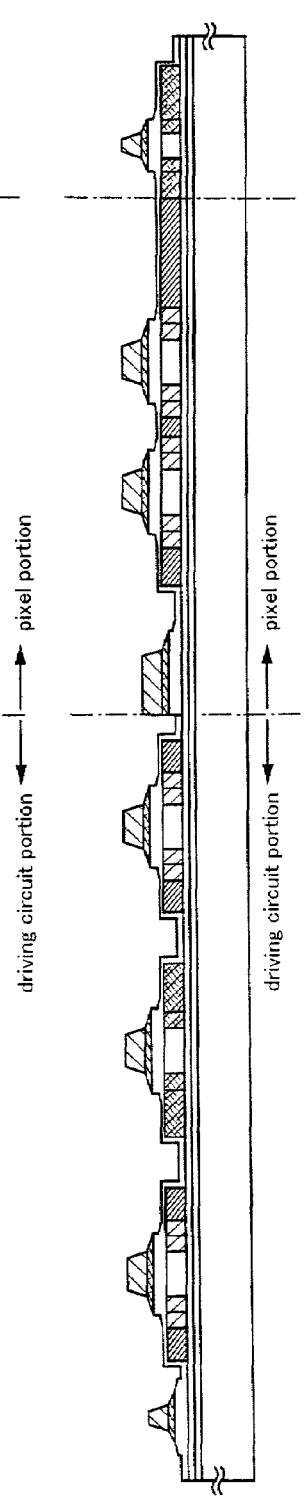
Figure 9:
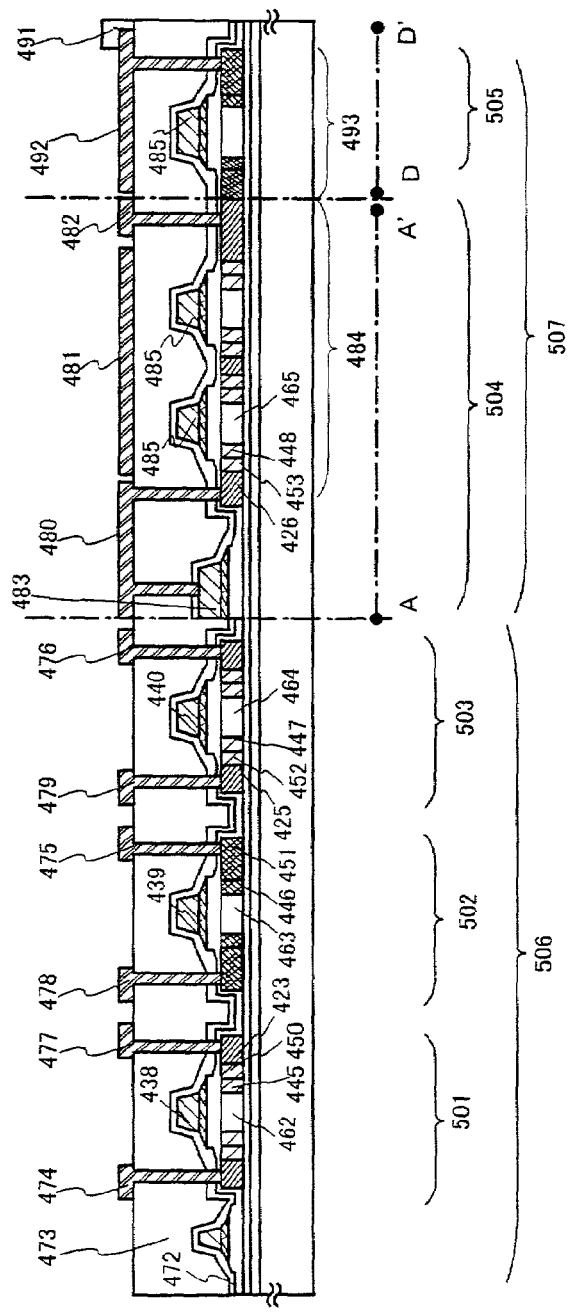
FIG. 9 is a cross sectional view showing a process for manufacturing the thin film transistor.
Figure 10A:
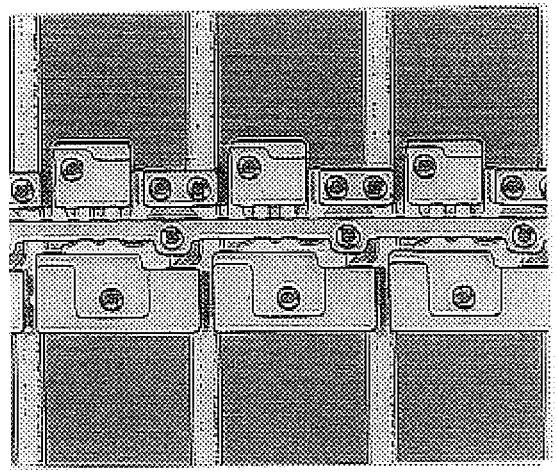
FIGS. 10A to 10C are photographs showing orientation of liquid crystal after a high temperature reliability test is performed for the liquid crystal display device of the present invention.
Figure 10B:
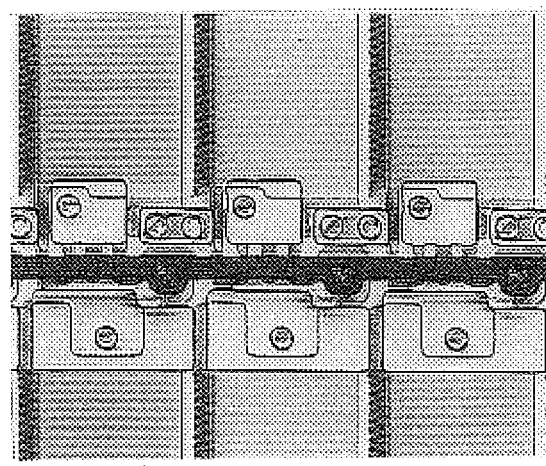
Figure 10C:
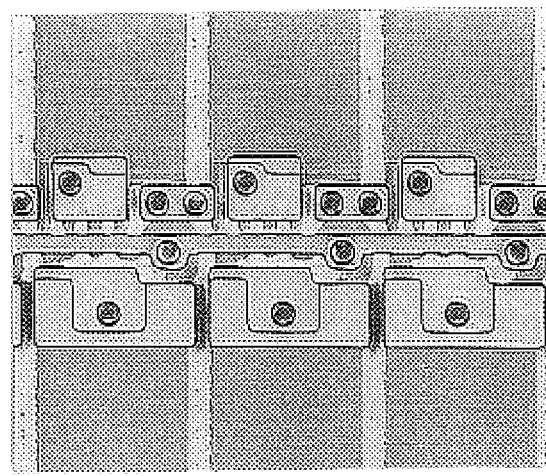
Figure 11C:
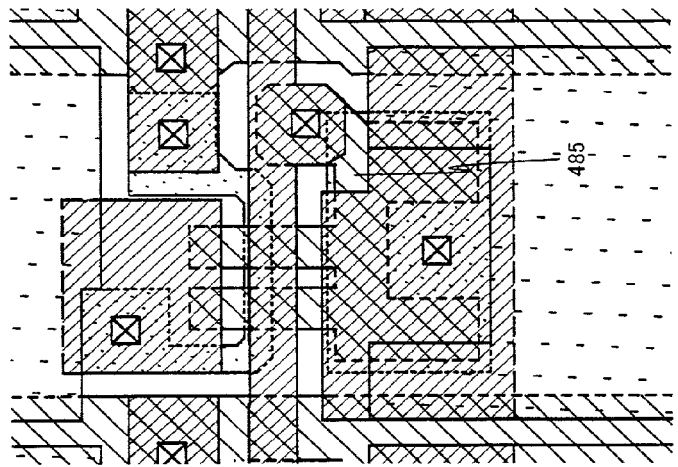
FIGS. 11A to 11C are top views showing the orientation of the liquid crystal after the high temperature reliability test is performed for the liquid crystal display device of the present invention.
Figure 11B:
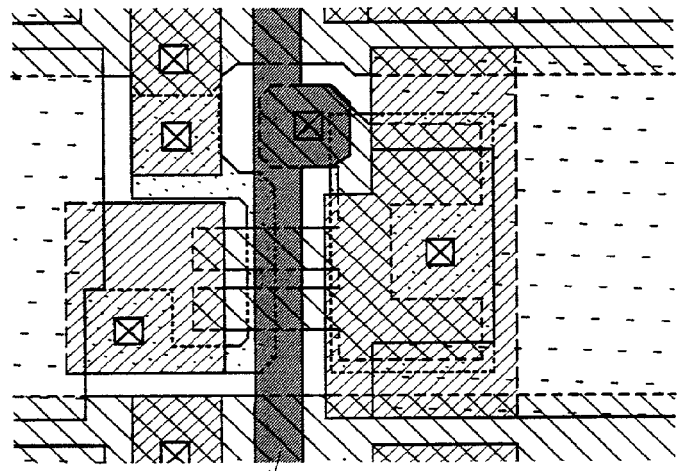
Figure 11A:
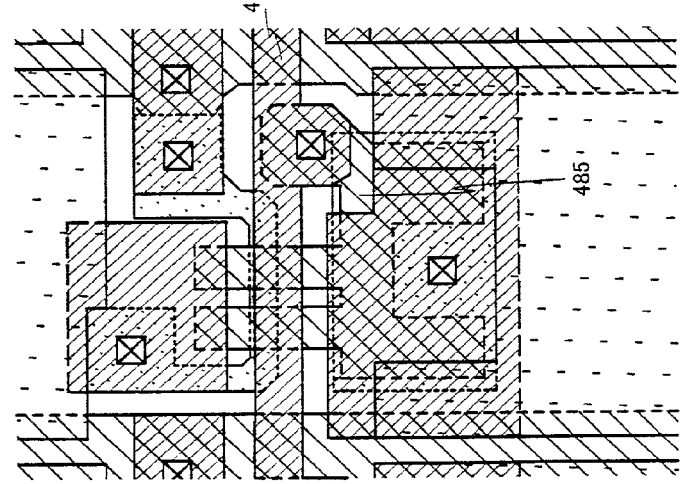
Figure 12A:
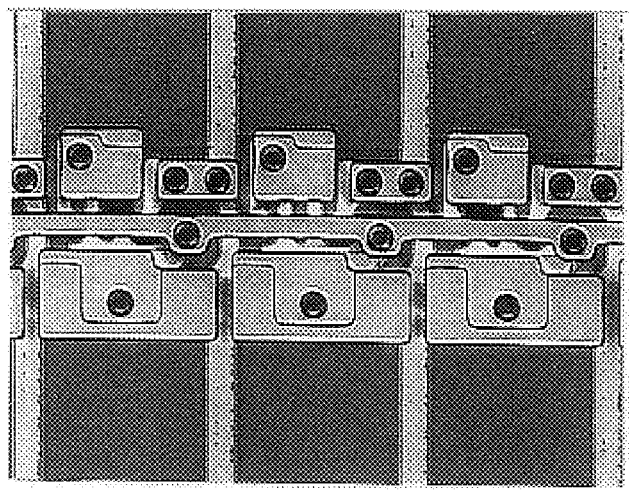
FIGS. 12A to 12C are photographs showing the orientation of the liquid crystal in the liquid crystal display device of the present invention.
Figure 12B:
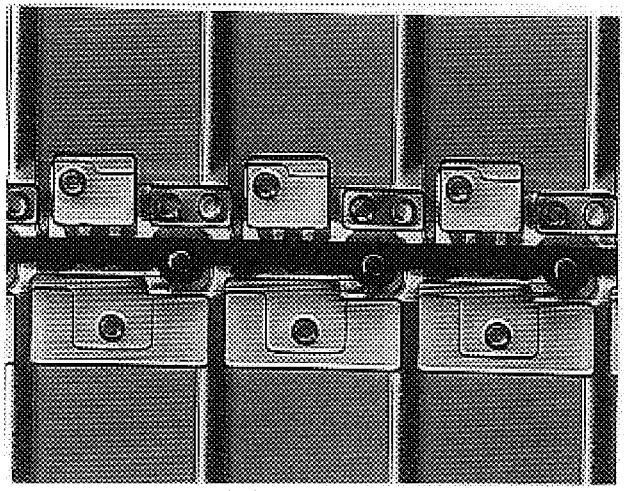
Figure 12C:
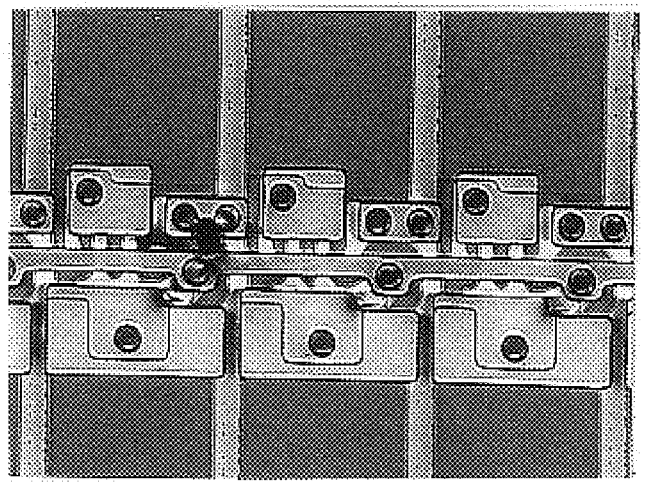

FIGS. 7 to 9 are used to explain Embodiments of the present invention. In this embodiment, a manufacturing method is explained precisely according to steps which is forming pixel TFT of the pixel portion and the storage capacitor; driver circuit TFT provided in periphery portion of the display region simultaneously.

In this embodiment, a description is set forth regarding a step for fabricating the pixel TFTs, which is switching elements in the pixel portion and TFTs for driver circuit (a signal line driver circuit and a scanning line driver circuit, or the like) provided in peripheral of the pixel portion over a same substrate. For the simplicity of the explanation, a CMOS circuit which is a fundamental structure circuit for the driver circuit portion, and an n-channel TFT for a pixel TFT in a pixel portion are illustrated with the cross section taken along a path.

First, as shown in FIG. 7A, a base film 401 made of an insulating film such as a silicon oxide film, a silicon nitride film, or a silicon oxynitride film, is formed on a substrate 400 made of a glass such as barium borosilicate glass or aluminum borosilicate glass, typically a glass such as Coming Corp. #7059 glass or #1737 glass. For example, a lamination film of a silicon oxynitride film 401a, manufactured from $SiH_4$, $NH_3$, and $N_2O$ by plasma CVD, and formed having a thickness of 10 to 200 nm (preferably between 50 and 100 nm), and a hydrogenated silicon oxynitride film 401b, similarly manufactured from $SiH_4$ and $N_2O$, and formed having a thickness of 50 to 200 nm (preferably between 100 and 150 nm), is formed. A two layer structure is shown for the base film 401 in Embodiment 1, but a single layer film of the insulating film, and a structure in which more than two layers are laminated, may also be formed.

Island shape semiconductor layers 402 to 406 are formed by crystalline semiconductor films made from a semiconductor film having an amorphous structure, using a laser crystallization method or a known thermal crystallization method. The thickness of the island shape semiconductor layers 402 to 406 may be formed from 25 to 80 nm (preferably between 30 and 60 nm). There are no limitations placed on the materials for forming a crystalline semiconductor film, but it is preferable to form the crystalline semiconductor films by silicon or a silicon germanium (SiGe) alloy.

A laser such as a pulse oscillation type or continuous light emission type excimer laser, a YAG laser, or a $YVO_4$ laser can be used to fabricate the crystalline semiconductor films by the laser crystallization method. A method of condensing laser light emitted from a laser oscillator into a linear shape by an optical system and then irradiating the light to the semiconductor film may be used when these types of lasers are used. The crystallization conditions may be suitably selected by the operator, but when using the excimer laser, the pulse oscillation frequency is set to 30 Hz, and the laser energy density is set form 100 to 400 $mJ/cm^2$ (typically between 200 and 300 $mJ/cm^2$). Further, when using the YAG laser, the second harmonic is used and the pulse oscillation frequency is set from 1 to 10 kHz, and the laser energy density may be set from 300 to 600 $mJ/cm^2$ (typically between 350 and 500 $mJ/cm^2$). The laser light condensed into a linear shape with a width of 100 to 1000 μm, for example 400 μm, is then irradiated over the entire surface of the substrate. This is performed with an overlap ratio of 80 to 98% for the linear laser light.

A gate insulating film 407 is formed covering the island shape semiconductor layers 402 to 406. The gate insulating film 407 is formed of an insulating film containing silicon with a thickness of 40 to 150 nm by plasma CVD or sputtering. A 120 nm thick silicon oxynitride film is formed in Embodiment 1. The gate insulating film is not limited to this type of silicon oxynitride film, of course, and other insulating films containing silicon may also be used in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHz) electric power density of 0.5 to 0.8 $W/cm^2$. Good characteristics as a gate insulating film can be obtained by subsequently performing thermal annealing, at between 400 and 500° C., of the silicon oxide film thus manufactured.

A first conductive film 408 and a second conductive film 409 are then formed on the gate insulating film 407 in order to form gate electrodes. The first conductive film 408 is formed of a TaN film with a thickness of 50 to 100 nm, and the second conductive film 409 is formed of a W film having a thickness of 100 to 300 nm, in Embodiment 1.

The W film is formed by sputtering with a W target, which can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 μΩcm. The resistivity can be lowered by enlarging the crystal grains of the W film, but for cases in which there are many impurity elements such as oxygen within the W film, crystallization is inhibited, thereby the film becomes high resistance. A W target having a purity of 99.9999% is thus used in sputtering. In addition, by forming the W film while taking sufficient care that no impurities from the gas phase are introduced at the time of film formation, the resistivity of 9 to 20 μΩcm can be achieved.

Note that, although the first conductive film 408 is a TaN film and the second conductive film 409 is a W film in Embodiment 1, both may also be formed from an element selected from the group consisting of Ta, W, Ti, Mo, Al, and Cu, or from an alloy material having one of these elements as its main constituent, and a chemical compound material. Further, a semiconductor film, typically a polycrystalline silicon film into which an impurity element such as phosphorus is doped, may also be used. Examples of preferable combinations other than that used in Embodiment 1 include: forming the first conductive film by tantalum (Ta) and combining it with the second conductive film formed from a W film; forming the first conductive film by tantalum nitride (TaN) and combining it with the second conductive film formed from an Al film; and forming the first conductive film by tantalum nitride (TaN) and combining it with the second conductive film formed from a Cu film.

Then, masks 410 to 415 are formed from resist, a resist and a first etching treatment is performed in order to form electrodes and wirings. An ICP (inductively coupled plasma) etching method is used in Embodiment 1. An etching gas is mixed, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. Selecting appropriately etching gas, the W film and the TaN film are etched to the approximately same level.

Edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 417 to 422 (first conductive layers 417a to 422a and second conductive layers 417b to 422b) are thus formed of the first conductive layers and the second conductive layers in accordance with the first etching process. Reference numeral 416 denotes a gate insulating film, and the regions not covered by the first shape conductive layers 417 to 422 are made thinner by etching of about 20 to 50 nm.

A first doping process is then performed, and an impurity element which imparts n-type conductivity is added. (FIG. 7B) Ion doping or ion injection may be performed for the method of doping. Ion doping is performed under the conditions of a dose amount of from $1\times10^{13}$ to $5\times10^{14}$ atoms/cm$^2$ and an acceleration voltage of 60 to 100 keV. A periodic table group 15 element, typically phosphorus (P) or arsenic (As) is used as the impurity element which imparts n-type conductivity, and phosphorus (P) is used here. The conductive layers 417 to 422 become masks with respect to the n-type conductivity imparting impurity element in this case, and first impurity regions 423 to 426 are formed in a self-aligning manner. The impurity element which imparts n-type conductivity is added to the first impurity regions 423 to 426 with a concentration in the range of $1\times10^{20}$ to $1\times10^{21}$ atoms/cm$^3$.

A second etching process is performed next, as shown in FIG. 7C. The ICP etching method is similarly used. A plasma is generated by introducing a reaction gas to a chamber and a supplying a predetermined RF electric power (13.56 MHz) to a coil shape electrode. Low RF electric power (13.56 MHz) is applied to the substrate side (test piece stage), and a self-bias voltage which is lower in comparison to that of the first etching process is applied. The W film is etched anisotropically forming second shape conductive layers 427 to 432.

A second doping process is then performed, as shown in FIG. 7C. The dose amount is made smaller than that of the first doping process in this case, and an impurity element which imparts n-type conductivity is doped under high acceleration voltage conditions. For example, doping is performed with the acceleration voltage set from 70 to 120 keV, and a dose amount of $1\times10^{13}$/cm$^2$, and a new impurity region is formed inside the first impurity region formed in the island shape semiconductor layers of FIG. 7B. The second conductive layers 427 to 430 are used as masks with respect to the impurity element, and doping is performed so as to also add the impurity element into regions under the first conductive layers 427a to 430a. Second impurity regions 433 to 437 that overlap the first conductive layers 427a to 430a are formed. The impurity element which imparts n-type conductivity is added such that the concentration becomes from $1\times10^{17}$ to $1\times10^{18}$ atoms/cm$^3$ in the second impurity regions.

As shown in FIG. 8A, the first conductive layer, TaN, is backward and also etched by etching the gate insulating film 416. Third shape conductive layers 438 to 443 (first conductive layers 438a to 443a and second conductive layers 438b to 443b) are formed. Reference numeral 444 denotes a gate insulating film, and the regions not covered by the third shape conductive layers 438 to 443 are made thinner by etching of about 20 to 50 nm.

In FIG. 8A, third impurity region 445 to 449 which is overlapped with the conductive layers 438a to 441a and fourth impurity region 450 to 454 which is outside the third impurity region are formed. Therefore the concentration of an impurity element which imparts n-type conductivity into third impurity region and fourth impurity region is equal to an impurity element in second impurity region approximately.

Forth impurity regions 458 to 461 having a conductivity type which is the opposite of the above conductivity type impurity element, are then formed as shown in FIG. 8B in the island shape semiconductor layers 403 and 406 which form p-channel TFTs. Third shape conductive layers 434 and 441 is used as a mask with respect to the impurity element, and the impurity regions are formed in a self-aligning manner. The island shape semiconductor layers 402, 404 and 405, which form n-channel TFTs, are covered over their entire surface areas by resist masks 455 to 457. Phosphorus is added to the impurity regions 458 to 461 at a different concentration, and ion doping is performed here using diborane (B$_2$H$_6$), so that the respective impurity regions have the impurity concentration of $2\times10^{20}$ to $2\times10^{21}$ atoms/cm$^3$.

Impurity regions are formed in the respective island shape semiconductor layers by the above processes. The conductive layers 438 to 441 overlapping the island shape semiconductor layer function as gate electrodes of TFT. Further, reference numeral 442 functions as a source wiring and 443 functions as a wiring inside the driver circuit. The first electrode 485 of the present invention denotes a conductive layer 441 forming a gate electrode.

A process of activating the impurity elements added to the respective island shape semiconductor layers is then performed, as shown in FIG. 8C, with the aim of controlling conductivity type. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 1. However, for cases in which the wiring material used in the wirings 438 to 443 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

A first interlayer insulating film 472 is formed of a silicon oxynitride film having a thickness of 100 to 200 nm as FIG. 9. An acrylic resin film or a polyimide resin film is formed to 1.8 μm thick as a second interlayer insulating film 473 made of an organic insulating material on the first interlayer insulating film 472. Etching is then performed in order to form contact holes.

Next, a conductive metal film is formed by a sputtering method or a vacuum evaporation method. That is, first, a Ti film is formed to have a thickness of 50 to 150 nm. A contact is formed between the Ti film and a semiconductor film composing a source region or a drain region of an island-like semiconductor film. Aluminum (Al) is formed to have a thickness of 300 to 400 nm on the Ti film, and then a Ti film or a titanium nitride (TiN) film is formed to have a thickness of 100 to 200 mn. Thus, a three layered structure is obtained.

Then, in the driver circuit portion, source wirings 474 to 476 for contact with the source regions of the island-like semiconductor films and drain wirings 477 to 479 for contact with the drain regions thereof are formed.

In addition, in the pixel portion, the connection electrode 480, the gate wiring 481, the drain electrode 482, and the second electrode 492 are formed. In this embodiment, the first electrode 485 is overlapped at 70% of its area with the second electrode.

The connection electrode 480 is electrically connected with the source wiring 483 and the first semiconductor film 484. Although not shown, the gate wiring 481 is electrically connected with the first electrode 485 through the contact hole. The drain electrode 482 is electrically connected with the drain region of the first semiconductor film 484. The second electrode 492 is electrically connected with the second semiconductor film 493, and thus the second semiconductor film 493 functions as the electrode of the retaining capacitor 505.

After that, a transparent conductive film is formed on the entire surface and the pixel electrode 491 is formed by patterning and etching using a photo mask. The pixel electrode 491 is formed on the second interlayer insulating film 473 and a portion overlapped with the drain electrode 482 of the pixel TFT and the second electrode 492 is provided in the pixel electrode 491. Thus, a connection structure is formed.

As a material of the transparent conductive film, indium oxide ($In_2O_3$), an alloy of indium oxide and tin oxide ($In_2O_3$-$SnO_2$:ITO), or the like can be used. The transparent conductive film is formed using the above material by a sputtering method, a vacuum evaporation method, or the like. Such a material is etched using a chlorine system solution. However, in particular, etching of the ITO is easy to cause the residue. Thus, in order to improve processing by etching, an alloy of indium oxide and zinc oxide ($In_2O_3$-ZnO) may be used. The alloy of indium oxide and zinc oxide has superior surface smoothness and thermal stability superior to the ITO. Thus, corrosion reaction to Al in contact with edges of the drain electrode 482 can be prevented. Similarly, zinc oxide (ZnO) is a suitable material and in order to further improve transmittance of visual light and conductivity, zinc oxide (ZnO:Ga) to which gallium (Ga) is added, or the like can be used.

Thus, the active matrix substrate corresponding to the transmission liquid crystal display device can be completed.

By the above processes, the driver circuit portion having an n-channel TFT 501, a P-channel TFT 502, and an n-channel TFT 503 and the pixel portion having a pixel TFT 504 and the retaining capacitor 505 can be formed on the same substrate. In this specification, such a substrate is called an active matrix substrate for convenience.

The n-channel TFT 501 in the driver circuit portion has a channel forming region 462, third impurity regions 445 (GOLD regions) overlapped with a conductive layer 438 composing the gate electrode, fourth impurity regions 450 (LDD regions) formed outside the gate electrode, and first impurity regions 423 which function as the source region or the drain region. The p-channel TFT 502 has a channel forming region 463, fifth impurity regions 446 overlapped with a conductive layer 439 composing the gate electrode, and sixth impurity regions 451 which function as the source region or the drain region. The n-channel TFT 503 has a channel forming region 464, third impurity regions 447 (GOLD regions) overlapped with a conductive layer 440 composing the gate electrode, fourth impurity regions 452 (LDD regions) formed outside the gate electrode, and first impurity regions 425 which function as the source region or the drain region.

The pixel TFT 504 in the pixel portion has a channel forming region 465, third impurity regions 448 (GOLD region) overlapped with the first electrode 485, fourth impurity regions 453 (LDD region) formed outside the gate electrode, and first impurity regions 426 which function as the source region or the drain region. In addition, an impurity element for providing a p-type is added to the semiconductor film 493 which functions as one electrode of the retaining capacitor 505. The retaining capacitor is constructed by the semiconductor film 493, the first electrode 485, and an insulating layer located therebetween (the same layer as the gate insulating film).

Cross sections obtained by cutting along dashed lines A-A' and D-D' in FIG. 9 correspond to those obtained by cutting the top view of FIG. 5 along dashed lines A-A' and D-D'.

The first electrode 485 is overlapped at 70% of its area as a wide area with the second electrode 492. Thus, when the transmission liquid crystal display device is manufactured using the active matrix substrate of this embodiment, such an unstable factor that the orientation is fixed to be left after the drive power source is turned off can be decreased.

Embodiment 2

The method of manufacturing the active matrix substrate in Embodiment 1 can be applied to the reflection liquid crystal display device.

First, processes are progressed in accordance with FIGS. 7A to 7C and 8A to 8C in Embodiment 1 to obtain the structure of FIG. 8C.

Figure 15:
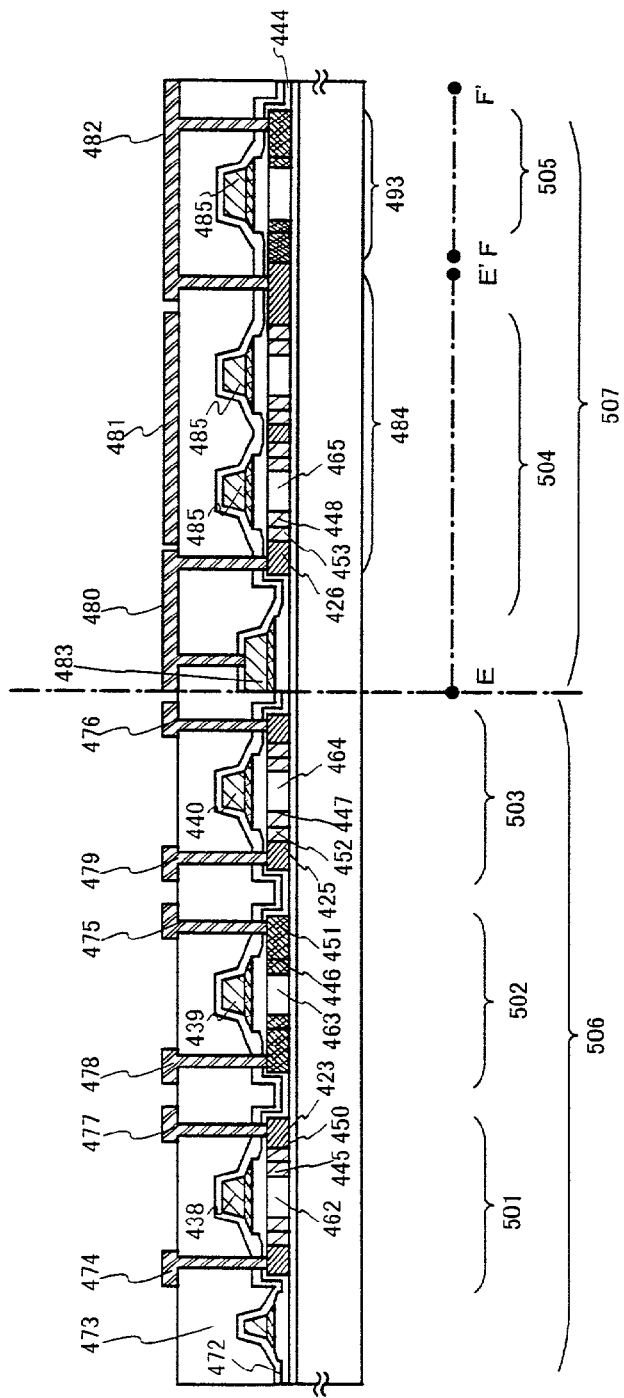
FIG. 15 is a cross sectional view of the pixel portion of the present invention.
Figure 16:
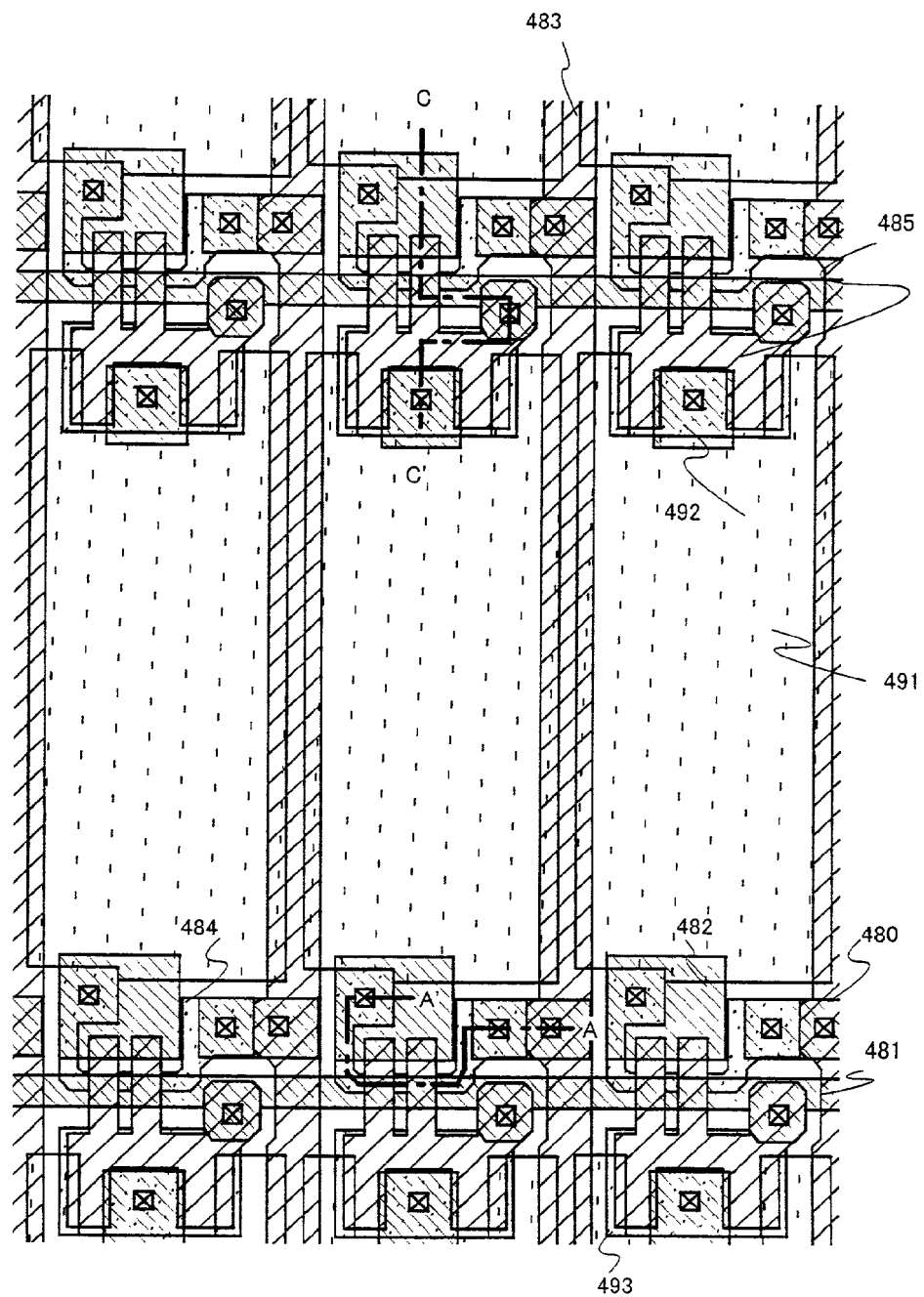
FIG. 16 is a top view of the pixel portion.
Figure 17:
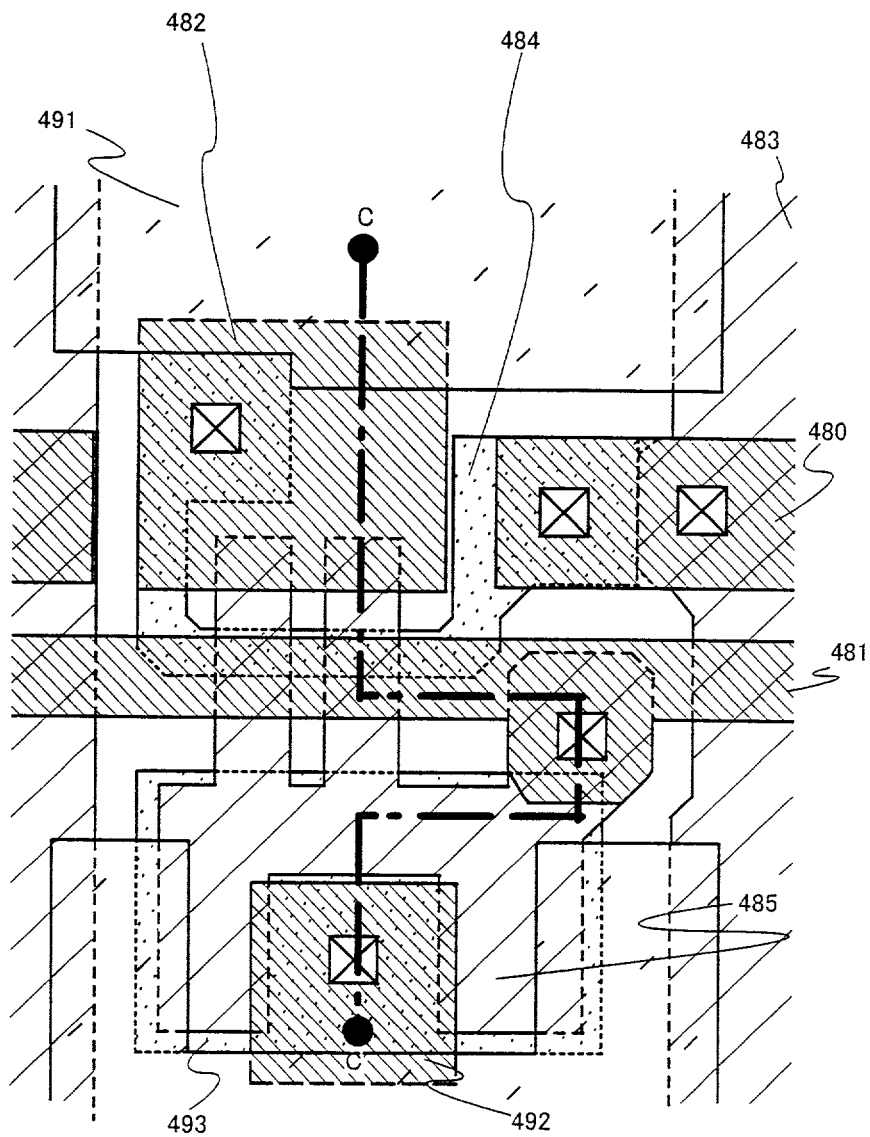
FIG. 17 is a top view of the pixel portion.
Figure 18A:
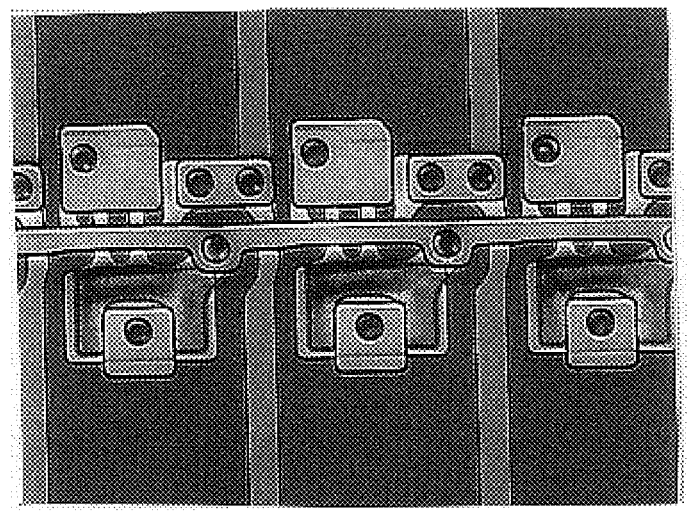
FIGS. 18A to 18C are photographs showing the orientation of the liquid crystal after the high temperature reliability test is performed for the liquid crystal display device.
Figure 18B:
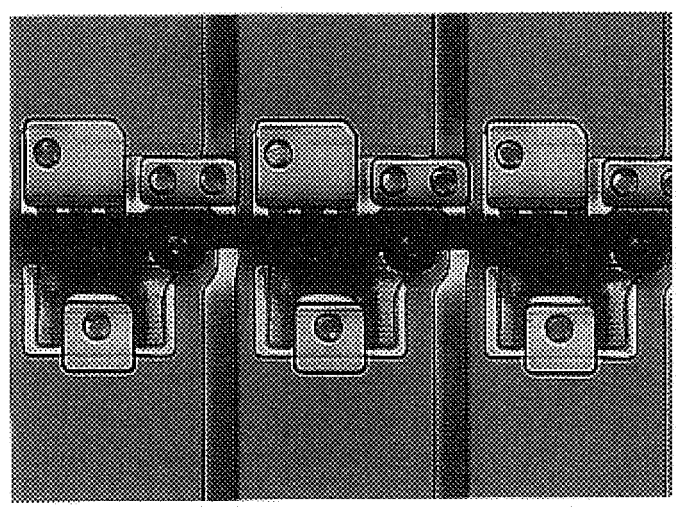
Figure 18C:
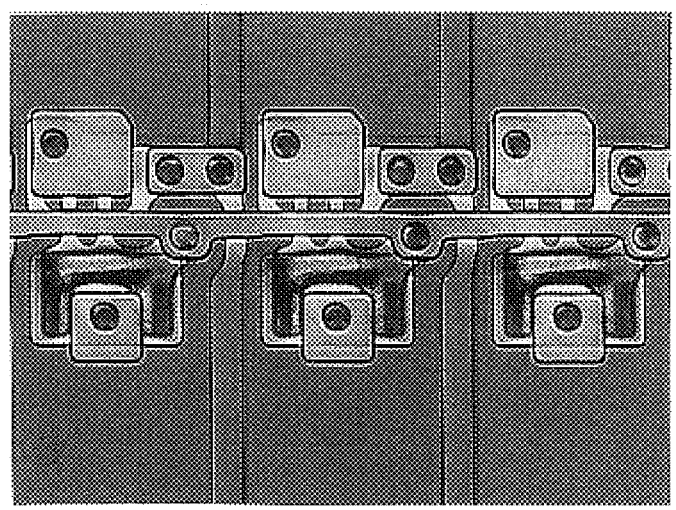
Figures 19A, 19B, 19C:
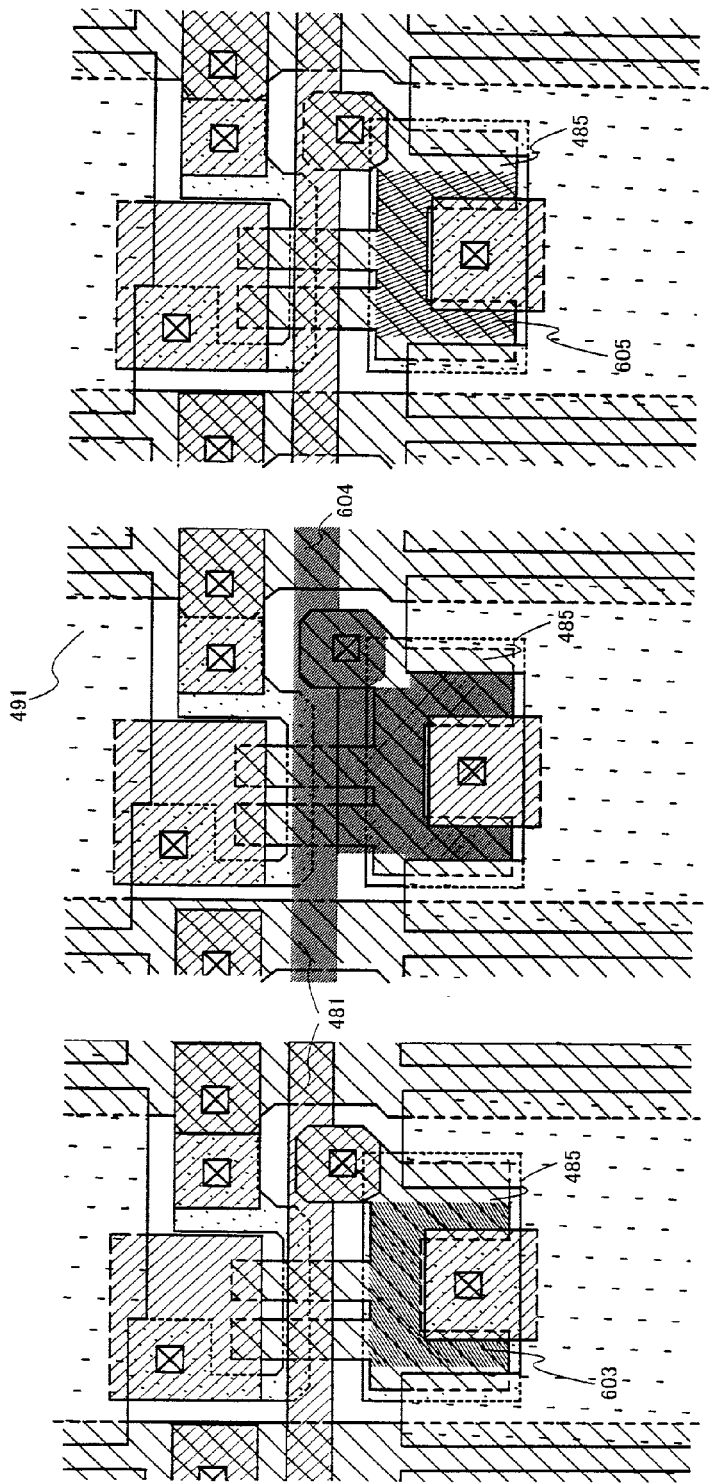
FIGS. 19A to 19C are top views showing the orientation of the liquid crystal after the high temperature reliability test is performed for the liquid crystal display device.
Figure 20A:
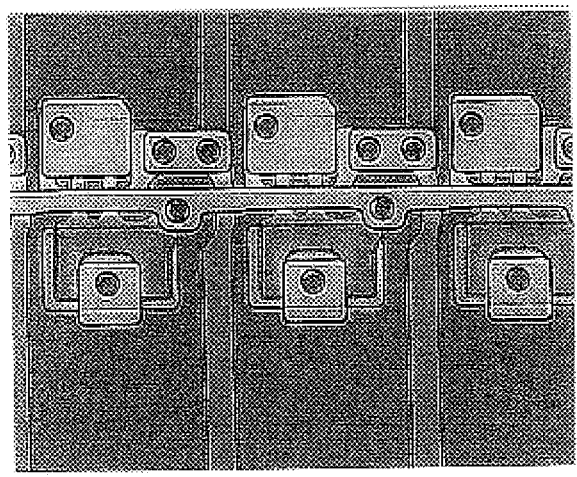
FIGS. 20A to 20C are photographs showing the orientation of the liquid crystal in the liquid crystal display device.
Figure 20B:
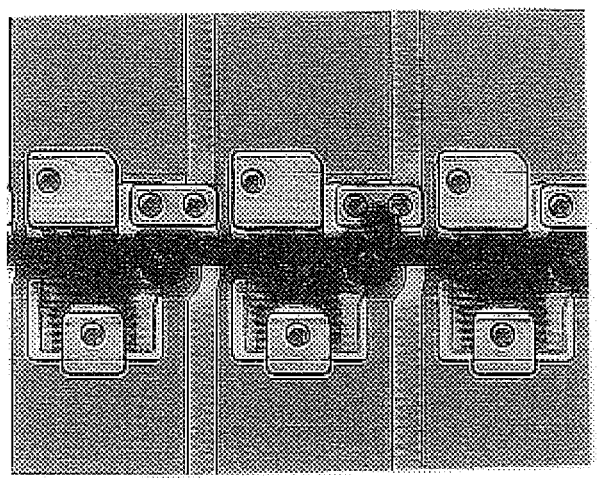
Figure 20C:
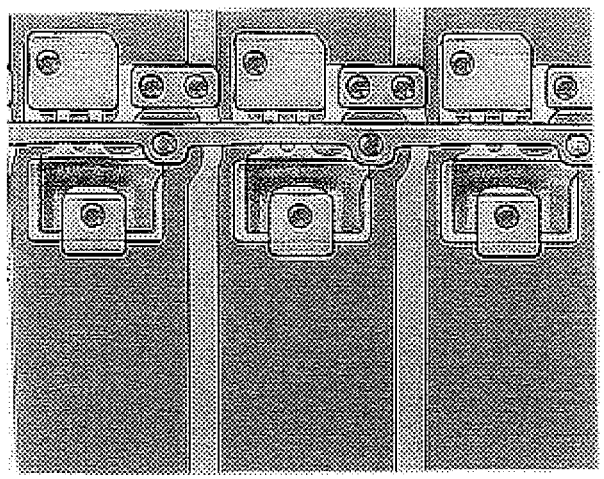
Figures 21A, 21B, 21C:
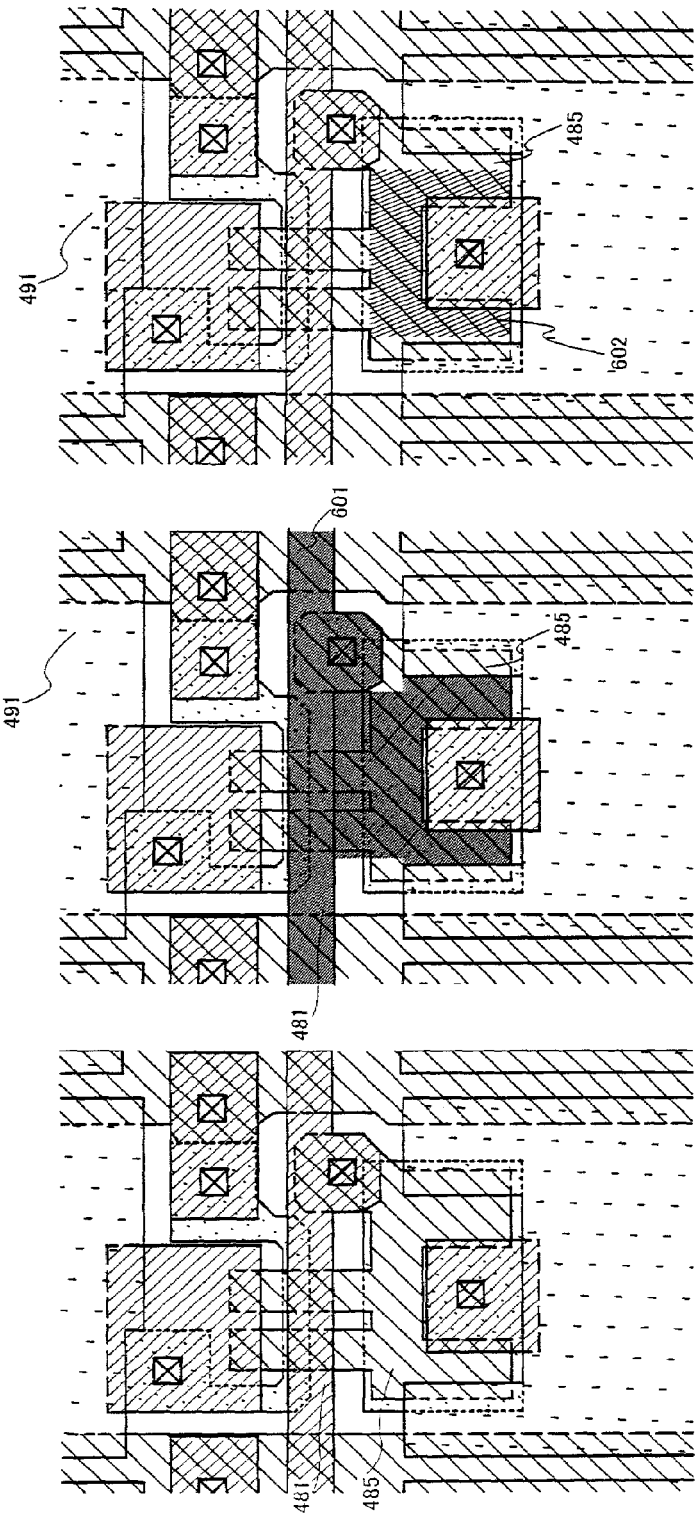
FIGS. 21A to 21C are top views showing the orientation of the liquid crystal in the liquid crystal display device.

Then, as shown in FIG. 15, a first interlayer insulating film 472 is formed using a silicon oxynitride film to have a thickness of 100 to 200 nm and an acrylic resin film or a polyimide film is formed thereon to have a thickness of 1.8 μm as a second interlayer insulating film 473 made of an organic insulator material. Next, an etching process for forming contact holes is performed.

Next, a conductive metal film is formed by a sputtering method or a vacuum evaporation method. That is, first, a Ti film is formed to have a thickness of 50 to 150 nm. A contact is formed between the Ti film and a semiconductor film composing a source region or a drain region of an island-like semiconductor film. Aluminum (Al) is formed to have a thickness of 300 to 400 nm on the Ti film, and then a Ti film or a titanium nitride (TiN) film is formed to have a thickness of 100 to 200 nm. Thus, a three layered structure is obtained.

Then, in the driver circuit portion, source wirings 474 to 476 for contact with the source regions of the island-like semiconductor films and drain wirings 477 to 479 for contact with the drain regions thereof are formed.

In addition, in the pixel portion, the connection electrode 480, the gate wiring 481, and the drain electrode 482 are formed. In this embodiment, the drain electrode 482 has a function as the pixel electrode in the reflection liquid crystal display device. The first electrode 485 is overlapped at 70% of its area with the drain electrode 482.

With respect to the retaining capacitor, the second semiconductor film 493 and the first electrode 485, which are provided in each pixel are used as electrodes. The gate insulating film (444) functions as a dielectric film of the retaining capacitor. The second semiconductor film 493 has the same potential as the pixel electrode 491. The first electrode 485 has the same potential as the gate wiring.

The connection electrode 480 is electrically connected with the source wiring 483 and the first semiconductor film 484. Although not shown, the gate wiring 481 is electrically connected with the first electrode 485 through the contact hole. The drain electrode 482 is electrically connected with the drain region of the first semiconductor film 484. In addition, the drain electrode 482 is electrically connected with the second semiconductor film 493, and thus the second semiconductor film 493 functions as the electrode of the retaining capacitor 505.

Thus, the active matrix substrate corresponding to the reflection liquid crystal display device can be completed.

By the above processes, the driver circuit portion having an n-channel TFT 501, a P-channel TFT 502, and an n-channel TFT 503 and the pixel portion having a pixel TFT 504 and the retaining capacitor 505 can be formed on the same substrate. In this specification, such a substrate is called an active matrix substrate for convenience.

The n-channel TFT 501 in the driver circuit portion has a channel forming region 462, third impurity regions 445 (GOLD regions) overlapped with a conductive layer 438 composing the gate electrode, fourth impurity regions 450 (LDD regions) formed outside the gate electrode, and first impurity regions 423 which function as the source region or the drain region. The p-channel TFT 502 has a channel forming region 463, fifth impurity regions 446 overlapped with a conductive layer 439 composing the gate electrode, and sixth impurity regions 451 which function as the source region or the drain region. The n-channel TFT 503 has a channel forming region 464, third impurity regions 447 (GOLD regions) overlapped with a conductive layer 440 composing the gate electrode, fourth impurity regions 452 (LDD regions) formed outside the gate electrode, and first impurity regions 425 which function as the source region or the drain region.

The pixel TFT 504 in the pixel portion has a channel forming region 465, third impurity regions 448 (GOLD regions) overlapped with a conductive layer (the first electrode) 485 composing the gate electrode, fourth impurity regions 453 (LDD regions) formed outside the gate electrode, and first impurity regions 426 which function as the source region or the drain region. In addition, an impurity element for providing a p-type is added to the semiconductor film 493 which functions as one electrode of the retaining capacitor 505. The retaining capacitor is constructed by the semiconductor film 493, the first electrode 485, and an insulating layer located therebetween (the same layer as the gate insulating film).

Figure 14:
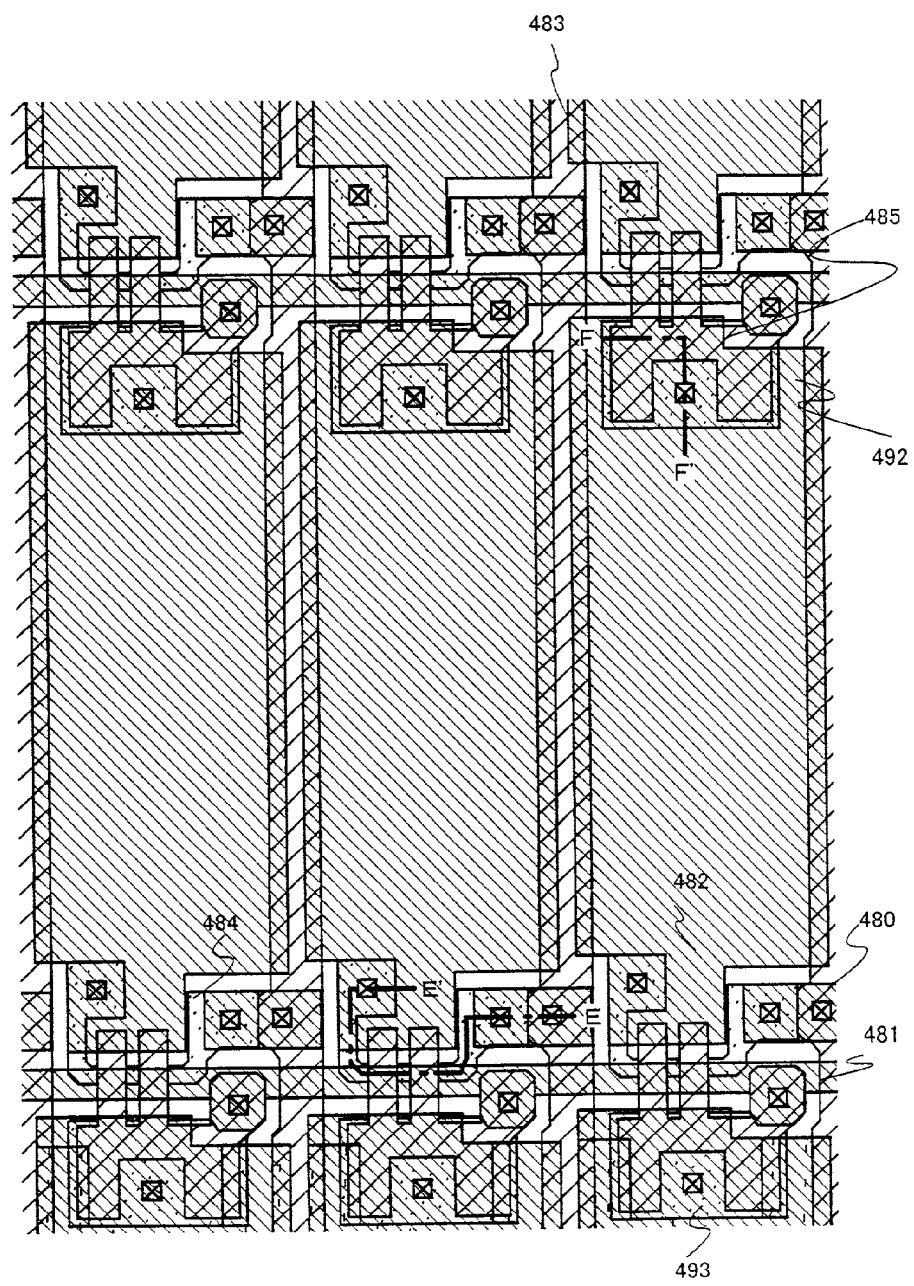
FIG. 14 is a top view of the pixel portion of the present invention.

Cross sections obtained by cutting the top view of FIG. 14 along dashed lines E-E' and F-F' correspond to those taken along dashed lines E-E' and F-F' in FIG. 15.

When the method as in Embodiment 1 is performed using the active matrix substrate of this embodiment, the reflection liquid crystal display device can be manufactured. At this time, the first electrode 485 is overlapped at 70% of its area with the second electrode. Thus, the electric field produced by the charges left in the electrode is blocked and thus the leakage of the electric field into the liquid crystal layer can be prevented.

Embodiment 3

Figure 6:
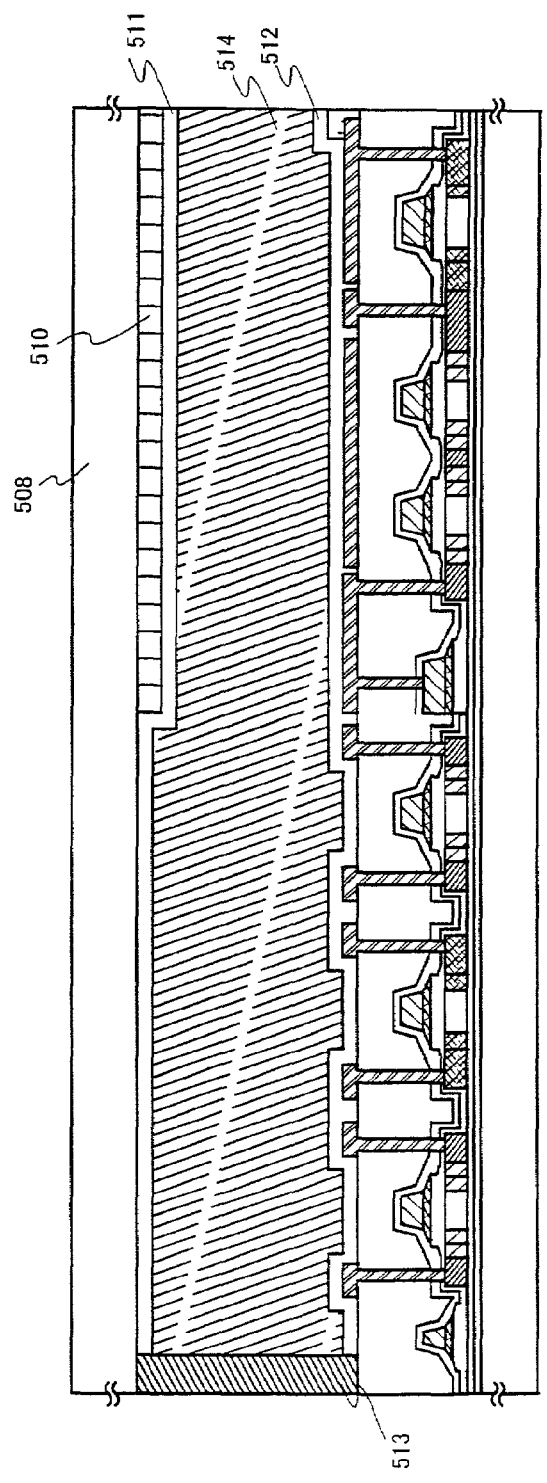
FIG. 6 is a cross sectional view of a liquid crystal display device.

In this embodiment, the manufacturing process of an active matrix liquid crystal display device from the active matrix substrate manufactured in Embodiment 1 is described below. FIG. 6 is used for explanation.

First, in accordance with Embodiment 1, the active matrix substrate in a state shown in FIG. 9 is obtained, and thereafter, an alignment film 512 is formed on the active matrix substrate of FIG. 9, and is subjected to a rubbing process. Note that, in this embodiment, before the formation of the alignment film 512, a columnar spacer for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 508 is prepared. On the opposing substrate 508, there are formed a colored layers, a light shielding layer and color filters arranged to correspond to the respective pixels. Further, the driver circuit portion is also provided with a light shielding layer. A leveling film is provided to cover the color filters and the light shielding layer. Next, in the pixel portion an opposing electrode 510 is formed from a transparent conductive film on the leveling film, an alignment film 511 is formed on the entire surface of the opposing substrate, and a rubbing process is conducted thereon.

Then, the active matrix substrate on which a pixel portion and a driver circuit are formed is stuck with the opposing substrate by a sealing agent 513. A filler is mixed in the sealing agent 513, and the two substrates are stuck with each other while keeping a uniform gap by this filler and the columnar spacer. Thereafter, a liquid crystal material 514 is injected between both the substrates to encapsulate the substrates completely by an encapsulant (not shown). A known liquid crystal material may be used as the liquid crystal material 514. Thus, the active matrix liquid crystal display device shown in FIG. 6 is completed. Then, if necessary, the active matrix substrate and the opposing substrate are parted into desired shapes. In addition, by using a known technique, a polarizing plate or the like may be suitably provided. Then, an FPC is stuck with the substrate using a known technique.

The liquid crystal display panel obtained in this way can be used as a display portion of various electronic devices.

Embodiment 4

The TFTs formed by implementing an embodiment among above-mentioned Embodiments 1 to 3 can be applied to all of the electronic equipments having these electro-optical devices as the display section.

The following can be given as examples of the electronic equipment: video cameras; digital cameras; projectors; head mounted displays (goggle type display); car navigation systems; car stereo; personal computers; portable information terminals (such as mobile computers, portable telephones and electronic notebook). An example of these is shown in FIGS. 22, 23 and 24.

Figure 22A:
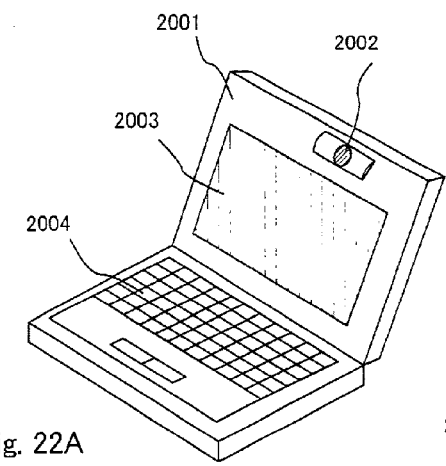
FIGS. 22A to 22F show examples of electronic equipment.

FIG. 22A shows a personal computer, and it includes a main body 2001, an image input section 2002, a display portion 2003, and a keyboard 2004. The present invention is applicable to the display portion 2003.

Figure 22B:
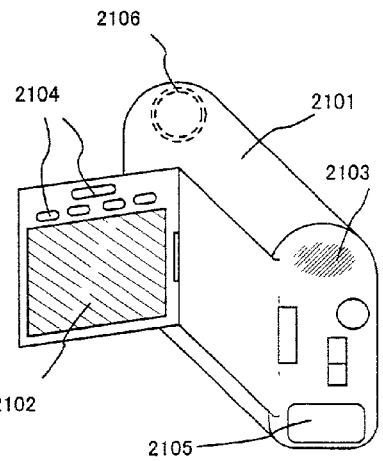

FIG. 22B shows a video camera, and it includes a main body 2101, a display portion 2102, a voice input section 2103, operation switches 2104, a battery 2105, and an image receiving section 2106. The present invention is applicable to the display portion 2102.

Figure 22C:
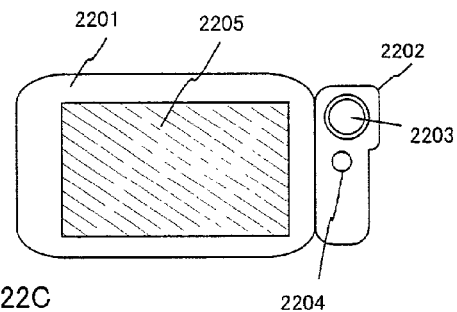

FIG. 22C shows a mobile computer, and it includes a main body 2201, a camera section 2202, an image receiving section 2203, operation switches 2204, and a display portion 2205. The present invention is applicable to the display portion 2205.

Figure 22D:
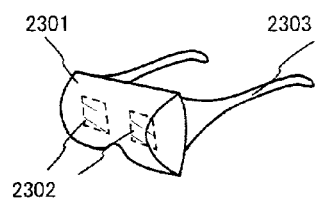

FIG. 22D shows a goggle type display, and it includes a main body 2301; a display portion 2302; and an arm section 2303. The present invention is applicable to the display portion 2302.

Figure 22E:
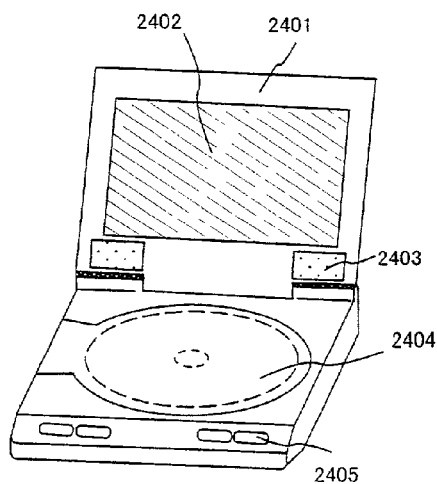

FIG. 22E shows a player using a recording medium which records a program (hereinafter referred to as a recording medium), and it includes a main body 2401; a display portion 2402; a speaker section 2403; a recording medium 2404; and operation switches 2405. This player uses DVD (digital versatile disc), CD, etc. for the recording medium, and can be used for music appreciation, film appreciation, games and Internet. The present invention is applicable to the display portion 2402.

Figure 22F:
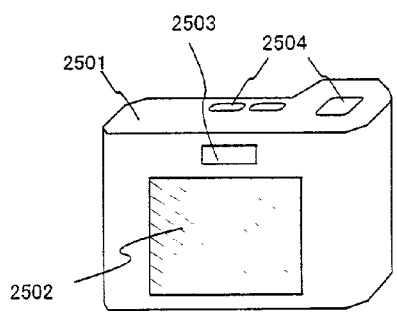

FIG. 22F shows a digital camera, and it includes a main body 2501; a display portion 2502; a view finder 2503; operation switches 2504; and an image receiving section (not shown in the figure). The present invention can be applied to the display portion 2502.

Figure 23A:
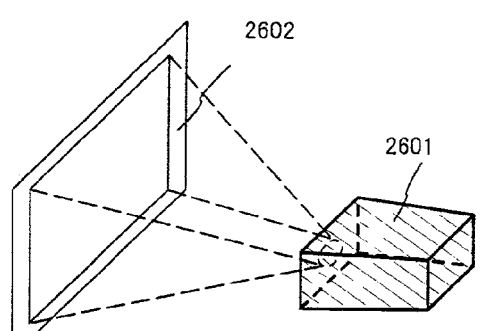

FIG. 23A is a front-type projector, and it includes a projection device 2601 and a screen 2602. The present invention is applicable to a liquid crystal display device 2808 which comprises one of the projection device 2601.

Figure 23B:
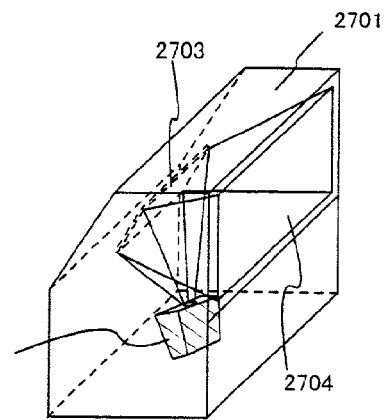

FIG. 23B is a rear-type projector, and it includes a main body 2701, a projection device 2702, a mirror 2703, and a screen 2704. The present invention is applicable to a liquid crystal display device 2808 which comprises one of the projection device 2702.

Figure 23C:
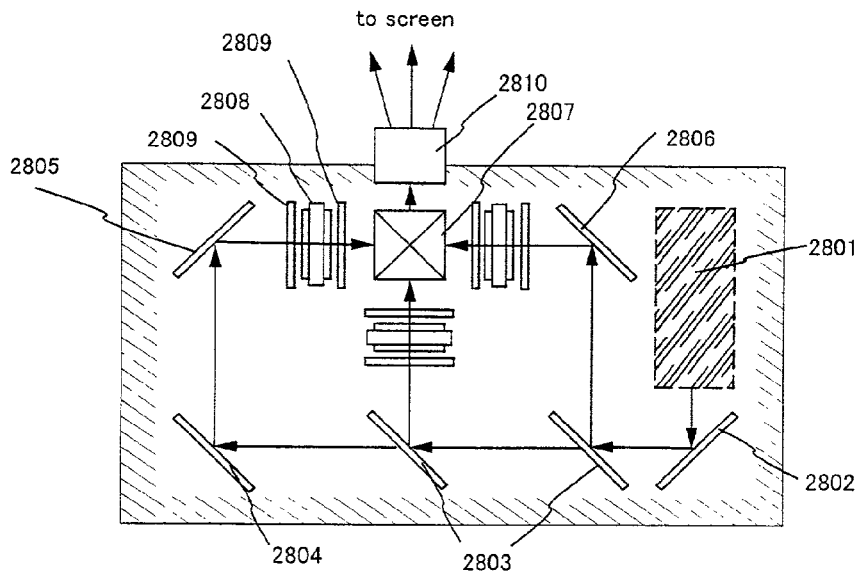

FIG. 23C is a diagram showing an example of the structure of the projection devices 2601, 2702 in FIGS. 23A and 23B. The projection device 2601 or 2702 comprises a light source optical system 2801, mirrors 2802, 2804 to 2806, dichroic mirrors 2803, a prism 2807, liquid crystal display devices 2808, phase difference plates 2809, and a projection optical system 2810. The projection optical system 2810 is composed of an optical system including a projection lens. This example shows an example of three plate type but not particularly limited thereto. For instance, the invention may be applied also to a single plate type optical system. Further, in the light path indicated by an arrow in FIG. 23C, an optical system such as an optical lens, a film having a polarization function, a film for adjusting a phase difference, and an IR film may be suitably provided by a person who carries out the invention.

Figure 23D:
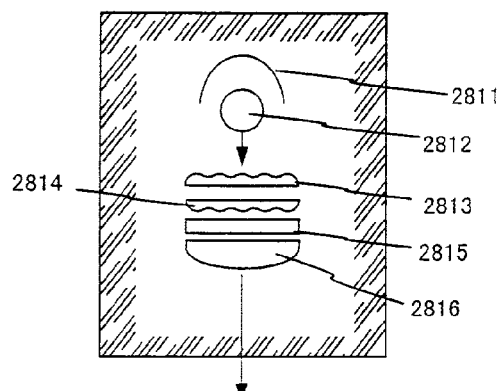

FIG. 23D is a diagram showing an example of the structure of the light source optical system 2801 in FIG. 23C. In this embodiment, the light source optical system 2801 comprises a reflector 2811, a light source 2812, lens arrays 2813, 2814, a polarization conversion element 2815, and a condenser lens 2816. The light source optical system shown in FIG. 23D is merely an example, and is not particularly limited to the illustrated structure. For example, a person who carries out the invention is allowed to suitably add to the light source optical system an optical system such as an optical lens, a film having a polarization function, a film for adjusting a phase difference, and an IR film.

Note that a transmission electro-optical device is used as the projector shown in FIG. 23, a reflection type electro-optical device is not illustrated.

Figure 24A:
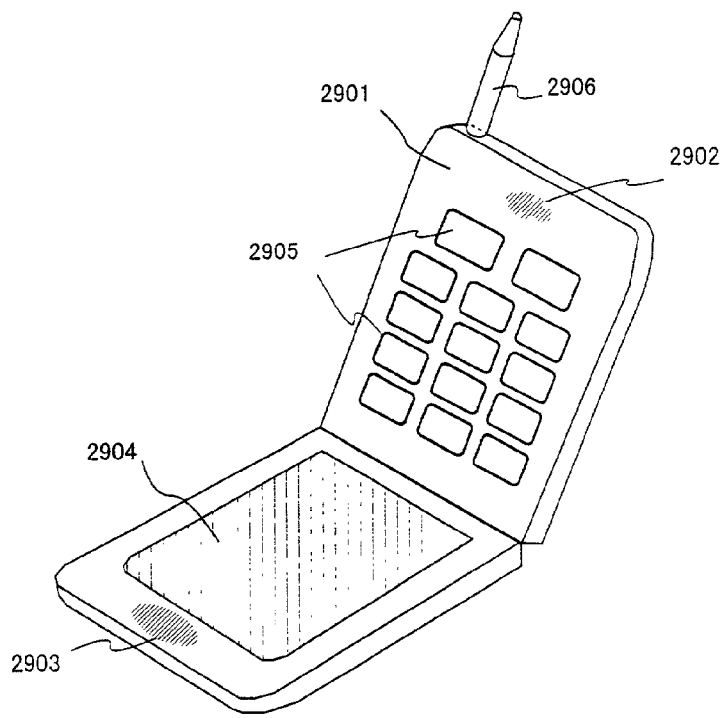
FIGS. 24A to 24C show examples of the electronic equipment.

FIG. 24A is a portable telephone, and it includes a main body 2901, an audio output section 2902, an audio input section 2903, a display portion 2904, operation switches 2905, and an antenna 2906. The present invention can be applied to the display portion 2904.

Figure 24B:
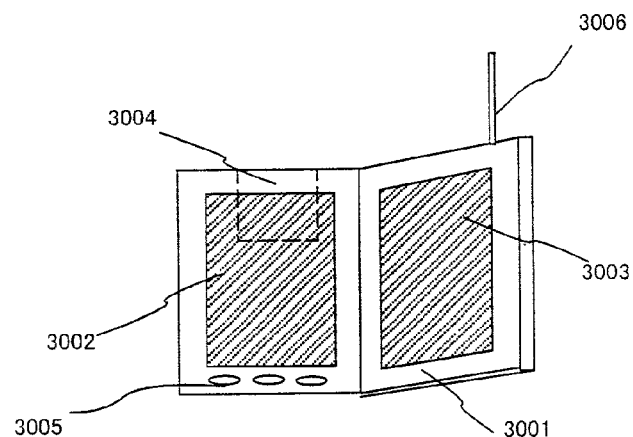

FIG. 24B is a portable book (electronic book), and it includes a main body 3001, display portions 3002 and 3003, a recording medium 3004, operation switches 3005, and an antenna 3006. The present invention can be applied to the display portions 3002 and 3003.

Figure 24C:
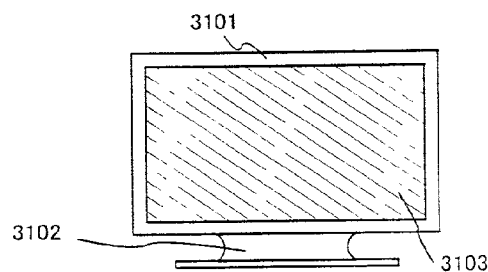

FIG. 24C is a display, and it includes a main body 3101, a support stand 3102, and a display portion 3103. The present invention can be applied to the display portion 3103. The display of the present invention is advantageous for a large size screen in particular, and is advantageous for a display equal to or greater than 10 inches (especially equal to or greater than 30 inches) in diagonal.

The applicable range of the present invention is thus extremely wide, and it is possible to apply the present invention to electronic equipment in all fields. Further, the electronic equipment of the embodiment 4 can be realized by using a constitution of any combination of the embodiments 1 to 3.

As described above, according to the present invention, the electric field that is produced by the charges left in the first electrode is blocked by the second electrode. Thus, the phenomenon can be reduced that the orientation of the liquid crystal is changed by the electric field that is produced by the charges left in the first electrode and then fixed and left after the drive power source is turned off. Therefore, a display device in which the long term reliability is high and the preferable display quality is obtained can be realized.

What is claimed is:

1. A semiconductor device comprising:
    a first electrode;
    an insulating film formed on said first electrode;
    a first contact hole which is provided in said insulating film and has a depth so as to reach said first electrode;
    a gate wiring which is formed on said insulating film and connected with said first electrode through said first contact hole and connected with a third electrode through a second contact hole;
    a second electrode provided on said insulating film; and
    a liquid crystal layer provided over said second electrode,
    wherein said first and third electrodes are each formed in different pixels,
    wherein said first electrode overlaps with said second electrode with the insulating film interposed therebetween, and
    wherein said second electrode is provided so as to block an electric field by said first electrode to said liquid crystal layer.

2. A semiconductor device according to claim 1, wherein a pixel electrode is formed on said insulating film and said second electrode is in contact with said pixel electrode.

3. A semiconductor device according to claim 1, wherein said second electrode is a pixel electrode.

4. A semiconductor device according to claim 1, wherein said semiconductor device is incorporated into an electronic equipment selected from the group consisting of a personal computer, a video camera, a mobile computer, a goggle type display, a player, a digital camera, a front-type projector, a rear-type projector, a portable telephone, a portable book, and a display.

5. A semiconductor device comprising:
    a semiconductor film;
    a gate insulating film provided on said semiconductor film;
    a first electrode which is provided on said gate insulating film and overlaps said semiconductor film;
    an insulating film formed on said first electrode;
    a first contact hole which is provided in said insulating film and has a depth so as to reach said first electrode;
    a gate wiring which is formed on said insulating film and connected with said first electrode through said first contact hole and connected with a third electrode through a second contact hole;
    a second electrode provided on said insulating film; and
    a liquid crystal layer provided over said second electrode,
    wherein said first and third electrodes are each formed in different pixels,
    wherein said first electrode overlaps with said second electrode with the insulating film interposed therebetween, and
    wherein said second electrode is provided so as to block an electric field by said first electrode to said liquid crystal layer.

6. A semiconductor device according to claim 5, wherein a pixel electrode is formed on said insulating film and said second electrode is in contact with said pixel electrode.

7. A semiconductor device according to claim 5, wherein said second electrode is a pixel electrode.

8. A semiconductor device according to claim 5, wherein said semiconductor device is incorporated into an electronic equipment selected from the group consisting of a personal computer, a video camera, a mobile computer, a goggle type display, a player, a digital camera, a front-type projector, a rear-type projector, a portable telephone, a portable book, and a display.

9. A semiconductor device comprising:
a first semiconductor film;
a second semiconductor film;
a gate insulating film provided on said first semiconductor film and said second semiconductor film;
a first electrode which is provided on said gate insulating film, intersects said first semiconductor film, and overlaps said second semiconductor film;
an insulating film formed on said first electrode;
a contact hole which is provided in said insulating film and has a depth so as to reach said first electrode;
a gate wiring which is formed on said insulating film and connected with said first electrode through said contact hole;
a second electrode provided on said insulating film; and
a liquid crystal layer provided over said second electrode,
wherein a storage capacitor is constructed by said first electrode, said gate insulating film, and said second semiconductor film,
wherein said first electrode overlaps with said second electrode with the insulating film interposed therebetween, and
wherein said second electrode is provided so as to block an electric field by said first electrode to said liquid crystal layer.

10. A semiconductor device according to claim 9, wherein a pixel electrode is formed on said insulating film and said second electrode is in contact with said pixel electrode.

11. A semiconductor device according to claim 9, wherein said second electrode is a pixel electrode.

12. A semiconductor device according to claim 9, wherein said semiconductor device is incorporated into an electronic equipment selected from the group consisting of a personal computer, a video camera, a mobile computer, a goggle type display, a player, a digital camera, a front-type projector, a rear-type projector, a portable telephone, a portable book, and a display.

13. A semiconductor device comprising:
a semiconductor film;
a gate insulating film provided on said semiconductor film;
a first electrode which is provided on said gate insulating film and overlaps said semiconductor film;
an insulating film formed on said first electrode;
a contact hole which is provided in said insulating film and has a depth so as to reach said first electrode;
a gate wiring which is formed on said insulating film and connected with said first electrode through said contact hole; and
a second electrode provided on said insulating film,
wherein a storage capacitor is constructed by said first electrode, said gate insulating film, and said semiconductor film and overlapped at 90% or more of an area thereof with said second electrode.

14. A semiconductor device according to claim 13, further comprising a liquid crystal layer provided over said second electrode.

15. A semiconductor device according to claim 13, wherein a pixel electrode is formed on said insulating film and said second electrode is in contact with said pixel electrode.

16. A semiconductor device according to claim 13, wherein said second electrode is a pixel electrode.

17. A semiconductor device according to claim 13, wherein said semiconductor device is incorporated into an electronic equipment selected from the group consisting of a personal computer, a video camera, a mobile computer, a goggle type display, a player, a digital camera, a front-type projector, a rear-type projector, a portable telephone, a portable book, and a display.

18. A semiconductor device comprising:
a first semiconductor film;
a second semiconductor film;
a gate insulating film provided on said first semiconductor film and said second semiconductor film;
a first electrode which is provided on said gate insulating film, intersects said first semiconductor film, and overlaps said second semiconductor film;
an insulating film formed on said first electrode;
a contact hole which is provided in said insulating film and has a depth so as to reach said first electrode;
a gate wiring which is formed on said insulating film and connected with said first electrode through said contact hole; and
a second electrode provided on said insulating film,
wherein a storage capacitor is constructed by said first electrode, said gate insulating film, and said second semiconductor film and overlapped at 90% or more of an area thereof with said second electrode.

19. A semiconductor device according to claim 18, further comprising a liquid crystal layer provided over said second electrode.

20. A semiconductor device according to claim 18, wherein a pixel electrode is formed on said insulating film and said second electrode is in contact with said pixel electrode.

21. A semiconductor device according to claim 18, wherein said second electrode is a pixel electrode.

22. A semiconductor device according to claim 18, wherein said semiconductor device is incorporated into an electronic equipment selected from the group consisting of a personal computer, a video camera, a mobile computer, a goggle type display, a player, a digital camera, a front-type projector, a rear-type projector, a portable telephone, a portable book, and a display.

* * * * *